United States Patent [19]
Senda et al.

[11] Patent Number: 5,990,417
[45] Date of Patent: Nov. 23, 1999

[54] ELECTROMAGNETIC NOISE ABSORBING MATERIAL AND ELECTROMAGNETIC NOISE FILTER

[75] Inventors: Masakatsu Senda, Mito; Toshinori Mori, Narashino; Osamu Ishii, Mito; Yasuhiro Koshimoto, Tokyo; Tomoyuki Toshima, Tokorozawa, all of Japan

[73] Assignee: Nippon Telegraph and Telephone Corporation, Tokyo, Japan

[21] Appl. No.: 08/257,769

[22] Filed: Jun. 6, 1994

[30] Foreign Application Priority Data

| Jun. 7, 1993 | [JP] | Japan | 5-163135 |
|---|---|---|---|
| Jun. 14, 1993 | [JP] | Japan | 5-167454 |
| Jul. 7, 1993 | [JP] | Japan | 5-168215 |
| Feb. 28, 1994 | [JP] | Japan | 6-055100 |
| Mar. 11, 1994 | [JP] | Japan | 6-068038 |

[51] Int. Cl.$^6$ .................................... H05K 9/00
[52] U.S. Cl. ....................................... 174/35 MS
[58] Field of Search ................ 174/35 R, 35 MS; 428/611, 692, 694 T, 402, 900, 546, 558, 928

[56] References Cited

U.S. PATENT DOCUMENTS

| 3,886,506 | 5/1975 | Lorber et al. | 333/96 |
|---|---|---|---|
| 4,731,500 | 3/1988 | Otsuka | 174/36 |
| 5,169,713 | 12/1992 | Kumurdjian | 428/323 |
| 5,373,102 | 12/1994 | Ehrlich et al. | 174/35 R |
| 5,585,196 | 12/1996 | Inomata et al. | 428/557 |

FOREIGN PATENT DOCUMENTS

| 2-67796 | 3/1990 | Japan . |
|---|---|---|
| 2-69001 | 3/1990 | Japan . |
| 3-211906 | 9/1991 | Japan . |
| 4-345007 | 12/1992 | Japan . |

OTHER PUBLICATIONS

"High frequency measurement technique for patterned soft magnetic film permeability with magnetic film/conductor/magnetic film inductance line", Senda et al., Rev. Sci. Instrum., vol. 64, No. 4, pp. 1034–1037, Apr. 1993.

"Application to an EMI Noise Filter of a High–Loss CoZrNb/SiO$_2$ Multilayer Film", Senda et al., vol. 18, No. 2, pp. 511–514, 1994.

Primary Examiner—Kristine Kincaid
Assistant Examiner—Hung V Ngo
Attorney, Agent, or Firm—Finnegan, Henderson, Farabow, Garrett & Dunner, L.L.P.

[57] ABSTRACT

Electromagnetic noise absorbing material and filter, which are small, light, and effective even with respect to unwanted electromagnetic waves of a few hundred MHz or more, are provided. A small and flexible electromagnetic noise filter cable and tape-shaped electromagnetic noise filter, as well as a manufacturing method and manufacturing apparatus therefor, are also provided. The electromagnetic noise absorbing material has a thickness or particle diameter of the alloy magnetic substance which is within a range of from $\frac{1}{10}$ to 10 times the skin depth thereof, and thereby, a large eddy current loss can be generated, so that it is possible to manufacture electromagnetic noise filters having various shapes, which are small, light, and which realize a large electromagnetic noise suppression effect as a result of eddy current loss, and these also possess a large relative magnetic permeability even at levels of a few hundred MHz or more. According to the thin film manufacturing method and apparatus, it is possible to easily manufacture an electromagnetic noise absorbing material having small hysteresis, possessing a hard axis of uni-axial magnetic anisotropy, which is superior in high-frequency response, and has a large electromagnetic noise suppression effect.

21 Claims, 21 Drawing Sheets

NITROGEN GAS
112
114
EASY AXIS DIRECTION OF UNIAXIAL MAGNETIC ANISOTROPY

.... : dn  5nm
--- : dn  50nm
— : dn 100nm

ELECTROMAGNETIC NOISE ABSORBING MATERIAL AND ELECTROMAGNETIC NOISE FILTER

BACKGROUND OF THE INVENTION

1. Field of the Invention

The present invention relates to an electromagnetic noise absorbing material and an electromagnetic noise filter, and to a manufacturing apparatus and method for a tape-shaped electromagnetic noise absorbing material.

2. Background Art

Recently, in concert with the spread of high-speed digital devices, the phenomenon in which unwanted electromagnetic waves generated by such devices cause interference with other devices (the electromagnetic compatibility problem, known as the EMC problem) has become a new environmental problem. For example, unwanted electromagnetic waves within a range of 30–1000 MHz generated when common mode noise current is placed on cables of a digital communication apparatus causes interference with respect to televisions and the like, and this is seen as a problem.

Conventionally, electromagnetic noise filters were employed which used magnetic substances as electromagnetic noise absorbing materials.

The relative magnetic permeability $\mu_r(f)$ of a magnetic substance is obtained by the following formula.

$$\mu_r(f)=\mu_r'(f)-j\cdot\mu_r''(f) \quad (1)$$

Here, $\mu_r'$ represents the effective relative magnetic permeability, $\mu_r''$ corresponds to the loss, j equals $(-1)^{1/2}$, and f represents the frequency.

Elect romagnetic noise filters employing magnetic substances make use of electromagnetic noise suppression effects resulting from the loss of the magnetic substance; it is necessary that the impedance and resistance with respect to electromagnetic noise be large. Accordingly, it is necessary that $|\mu_r|$, the absolute value of $\mu_r$, and $\mu_r''$ be large, and that $\mu_r''$ be greater than $\mu_r'$, in such electromagneti c noise absorbing m aterials.

Frequency characteristics of a representative relative magnetic permeability ($\mu_r'(0)=1500$) in ferrite magnetic substances, which were conventionally used as electromagnetic noise absorbing materials, are shown in FIG. 37 (Junnosuke Kamitoono: "Denji Kankyoti Kougaku Jyouhou", page 152, Jun. 30, 1992, Special Issue, Mimatsu Data Systems). Between the relative magnetic permeability $\mu_r'(0)$ of the ferrite magnetic substance and the upper limit frequency $f_c$ ($f_c$ is defined as the frequency at which $\mu_r''$ exhibits a peak), the following limit law holds:

$$\mu_r'(0)\times f_c=5.6 \text{ GHz} \quad (2);$$

in ferrite, this is due to the use of magnetic resonance loss as magnetic loss (Soushin Chikazumi: "Jiseitai no Butsuri (second half)", page 325, Shokabou, Mar. 20, 1984). The dotted line in FIG. 37 indicates the limit line of Formula (2). This indicates that in Formula (2), in the case in which the frequency characteristics of the ferrite magnetic substance are set so that $\mu_r''$ becomes larger within a specified frequency band, the values of $|\mu_r|$ and $\mu_r''$ are uniquely determined. The frequency characteristics of the relative magnetic permeability in a Mn—Zn ferrite, comprising a representative ferrite magnetic substance, are shown in FIG. 38. The condition $\mu_r''>\mu_r'$ is met at a level of a few MHz or more; however, the absolute value of $\mu_r$ is only this small value. In this case, in order to increase the electromagnetic noise absorbing effect, there is no other method than to increase the volume, and accordingly, it is necessary to use large amounts of the electromagnetic noise absorbing material, and this creates a problem in that the product size becomes large.

Furthermore, as shown in FIGS. 37 and 38, the relative magnetic permeability of the ferrite magnetic substance has an extremely small value in the high frequency band, so that the effects as an electromagnetic noise absorbing material decrease drastically at a level of a few hundred MHz or more. That is to say, there are defects in that the electromagnetic noise suppression effect is small with conventional electromagnetic noise absorbing materials, and the electromagnetic noise suppression effect declines dramatically at levels of a few hundred MHz or more.

Examples of the conventional electromagnetic noise filter employing the electromagnetic noise absorbing material (ferrite magnetic substance) described above include the ferrite core 901 shown in FIG. 39, which was conventionally employed. The size thereof is such that, for example, d=10 mm, t=4 mm, and 1=30 mm. As shown in FIG. 40, this is installed on a cable 902. The electromagnetic noise filter must have a large impedance and resistance, and a level within a range of from a few tens to 100 Ω at 30–1000 SHz is necessary. The frequency characteristics of the impedance $(Z=R+j\cdot X)$ in the ferrite core are shown in FIG. 41. Here, Z indicates the impedance, R indicates the resistance, x indicates reactance, and j indicates $(-1)^{1/2}$. At 30–1000 MHz, Z and R have values within a range of from a few tens to 200 Ω, and thus meet the above conditions; however, the ferrite core has a large volume and weight in comparison with other electrical parts, and when this is loaded, the flexibility of the cable is lost. Furthermore, the impedance is reduced at levels of a few hundred MHz or more, so that such an electromagnetic noise filter is not effective with respect to electromagnetic noise of a few hundred MHz or more.

Another example of an electromagnetic noise filter employing a conventional electromagnetic noise absorbing material (ferrite magnetic substance) is the ferrite bead shown in FIG. 42. For example, the size thereof is such that r=0.65 mm, tm=1.1 mm, and 1=5.0 mm, and $\mu_r'(0)=1500$. The electrical circuits and the conductor of the cable are passed through the interior of this cylinder. The frequency characteristics of the impedance in this case are shown in FIG. 43 (Junnosuke Kamitoono: "Denji Kankyou Kougaku Jyouhou", page 152, Jun. 30, 1992, Special Issue, Mimatsu Data Systems).

A value of a few tens of Ω is exhibited at 30–1000 MHz; however, in the electrical circuitry, in comparison with other electrical parts, the sizes of the parts are quite large. In this way, the conventional electromagnetic noise filters (ferrite cores, ferrite beads) possess problems in that the part size was large, the flexibility of the cable was lost, and such electromagnetic noise filters were ineffective with respect to electromagnetic noise at a level of a few hundred MHz or more.

Furthermore, FIG. 44 shows a conventional cable (for example, having a diameter of 10 mm and 24 wires); for example, cables are passed through the interior of the cylinders of the ferrite cores. In the Figure, reference numeral 903 indicates a conductor, reference numeral 904 indicates an insulator, reference numeral 905 indicates a shield material, and reference numeral 906 indicates an insulator. Conventional cables do not possess an electromagnetic noise suppression function, and furthermore, as a result of the combination of a conventional cable and an electromagnetic noise filter (ferrite core), the volume and weight of the part become large, and the flexibility of the cable is lost.

FIG. 45 shows a thin film manufacturing apparatus which was conventionally used for manufacturing a metal magnetic tape for magnetic recording media. This apparatus comprises raw material source 907, feed bobbin 908, winding bobbin 909, guide axles 910, and cylindrical can 911. A non-magnetic insulator tape substrate 912 is sent from feed bobbin 908 to winding bobbin 909, along guide axles 910 and cylindrical can 911, and a magnetic film is deposited on the non-magnetic insulator tape substrate 912 in a vacuum. Magnetic recording media do not require that uni-axial magnetic anisotropy within the film surface of, in particular, the magnetic film, be present, so that during the deposition of the magnetic film, an external magnetic field was not applied in a direction within the film surface of the magnetic film. Furthermore, for this reason, the thin film manufacturing apparatus was not provided with a mechanism for applying an external magnetic field in a direction within the film surface of the magnetic film, during the deposition of the magnetic film.

SUMMARY OF THE INVENTION

Accordingly, it is an object of the present invention to provide an electromagnetic noise absorbing material and an electromagnetic noise filter which solves the problems present in various conventional electromagnetic noise filters, namely, that the volume and weight thereof was large, and that such electromagnetic noise filters were ineffective at levels of a few hundred MHz or more, and which are effective with respect to unwanted electromagnetic waves of a few hundred MHz or more.

Furthermore, the present invention has as a further object thereof to provide, as an application thereof, an electromagnetic noise filter cable possessing an electromagnetic noise suppression function, which is smaller than the conventional combination of an electromagnetic noise filter and a cable, and is flexible, and furthermore, to provide a small, flexible, high frequency operation tape-shaped electromagnetic noise filter, as well as to provide a manufacturing method and manufacturing apparatus therefor.

Accordingly, the present invention provides:

a first electromagnetic noise absorbing material, possessing a film-shaped alloy magnetic substance, wherein the thickness of the alloy magnetic substance is within a range of from $1/10$ to 10 times the skin depth thereof;

a second electromagnetic noise absorbing material, possessing a particle-shaped alloy magnetic substance, wherein the particle diameter of the alloy magnetic substance is within a range of from $1/10$ to 10 times the thickness of the skin depth;

an electromagnetic noise filter, wherein one or more layers of any of the electromagnetic noise absorbing materials described above are wound in a tube shape;

an electromagnetic noise filter tape, comprising any of the electromagnetic noise absorbing materials described above in a tape shape;

a magnetic tube, comprising any of the electromagnetic noise absorbing materials described above formed in a cylindrical shape;

a magnetic wave absorbing sheet, having a structure in which a plurality of electromagnetic wave absorbing sheets, comprising solely any of the above electromagnetic noise absorbing materials, or electromagnetic wave absorbing sheets, in which any of the above electromagnetic noise absorbing materials is joined to a non-magnetic insulating sheet substrate, are overlapped, and the directions of uni-axial magnetic anisotropy within the film surfaces of the electromagnetic noise absorbing materials in the various electromagnetic wave absorbing sheets diverge from one another so as to form differing predetermined angles;

an electromagnetic wave absorbing sheet, in which the directions of uniaxial magnetic anisotropy within the film surfaces of the alloy magnetic substances of a multilayered structure comprising the first noise absorbing material described above diverge from one another so as to form differing predetermined angles;

an electromagnetic noise filter cable, in which a conductive shield material is clad around the circumference of one or more conductors clad in an insulating material, an outer side of the shield material is clad in any of one of the electromagnetic noise absorbing materials described above, via an insulating material, and an outer side of the electromagnetic noise absorbing material is further clad in an insulating material;

a device-type electromagnetic noise filter, possessing electrode portions at both ends of a conducting film, in which electromagnetic noise absorbing materials are disposed so as to surround the conducting film, or so as to be present on both sides of the conducting film, and in the case in which the electromagnetic noise absorbing material is conductive, the electromagnetic noise absorbing material is bonded to the conductive film through the medium of an insulating material, while, in the case in which the electromagnetic noise absorbing material is insulating, the electromagnetic noise absorbing material is either bonded to the conductive film through the medium of an insulating material, or, the electromagnetic noise absorbing material is directly bonded to the conductive film;

an electromagnetic noise filter tape manufacturing method, wherein, in the case in which the electromagnetic noise absorbing materials described above are manufactured using a thin film manufacturing method which is provided with a feed bobbin, a winding bobbin, one or more guide axles, one or more cylindrical cans, and one or more raw material sources, wherein a non-magnetic insulating tape substrate is caused to travel from the feed bobbin to the winding bobbin along the guide axles and the cylindrical cans, and a magnetic material is deposited on the non-magnetic insulating tape substrate in a vacuum, and the electromagnetic noise absorbing material is deposited while applying an external magnetic field in a pre-specified direction within the film surface of the electromagnetic noise absorbing material; and an electromagnetic noise filter tape manufacturing apparatus, wherein, in the case in which the electromagnetic noise absorbing materials described above are manufactured using a thin film manufacturing apparatus possessing a feed bobbin, a winding bobbin, one or more guide axles, one or more cylindrical cans, and one or more raw material sources, in which a non-magnetic insulating tape substrate is caused to travel from the feed bobbin to the winding bobbin along the guide axles and the cylindrical cans, and a magnetic substance is deposited on the non-magnetic insulating tape substrate in a vacuum, and a mechanism for applying an external magnetic field in a predetermined direction within the film surface of the electromagnetic noise absorbing material during the deposition of the electromagnetic noise absorbing material, is provided.

In accordance with the electromagnetic noise absorbing material described above, by means of setting the thickness or the particle diameter of the alloy magnetic material to a value within a range from 1/10 to 10 times the skin depth thereof, it is possible to generate a large eddy current loss. Using this, it is possible to manufacture electromagnetic noise filters having various shapes which are small and light and which realize a large electromagnetic noise-suppression effect resulting from eddy current loss. Furthermore, as these electromagnetic noise filters have a large relative magnetic permeability even at a level of a few hundred MlHz or more, such filters are effective even with respect to unwanted electromagnetic waves of a few hundred MHz or more.

Furthermore, in the electromagnetic noise filter cable described above, the cable itself has electromagnetic noise suppression effects, so that it is not necessary to combine an electromagnetic noise filter and a cable, as was conventionally the case, so that it is possible to impart high added value to the cable and to reduce the size of the cable. Furthermore, if aluminum leaf and vinyl or captone are selected for the shield material and the insulating material of the electromagnetic noise filter cable, it is possible to maintain flexibility identical to that of conventional cables.

Furthermore, the device-type electromagnetic noise filter described above is capable of effectively absorbing magnetic fields generated by electromagnetic noise currents flowing through conductive films, and accordingly, it is possible to obtain sufficiently large electromagnetic noise-suppression effects even if the product size is small.

Furthermore, in accordance with the electromagnetic noise filter tape manufacturing method and electromagnetic noise filter tape manufacturing apparatus described above, it is possible to easily manufacture an electromagnetic noise absorbing material having small hysteresis and having a large electromagnetic noise-suppression effect possessing a hard axis of uni-axial magnetic anisotropy having superior high frequency response.

BRIEF DESCRIPTION OF THE DRAWINGS

FIG. 1A shows the case of a single layered alloy magnetic substance;

FIG. 1B shows the case of a plurality of alloy magnetic substance layers and non-magnetic insulating substance layers which are layered alternately; and FIG. 1C is a partially enlarged view of Fig. 1B.

FIG. 3A shows the case in which uni-axial magnetic anisotropy is present, while FIG. 3B shows the case in which uni-axial magnetic anisotropy is not present.

FIGS. 21A and 21B show differing examples.

FIGS. 23A, 23B, 23C, and 23D show differing methods.

FIG. 31A is a perspective view, while FIG. 31B is a vertical cross sectional view.

DETAILED DESCRIPTION OF THE INVENTION

Hereinbelow, embodiments of the present invention will be explained with reference to the diagrams.

Section 1: First Embodiment of the Electromagnetic Noise Absorbing Material

Figure 1A:
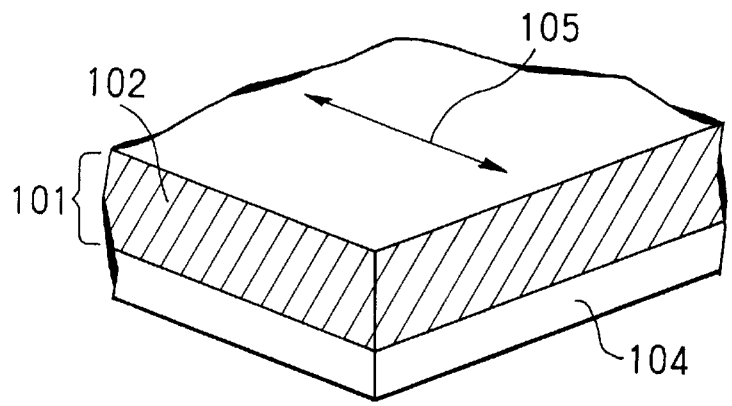
FIGS. 1A, 1B, and 1C show the structure of a first embodiment of an electromagnetic noise absorbing material in accordance with the.present invention.
Figure 1B:
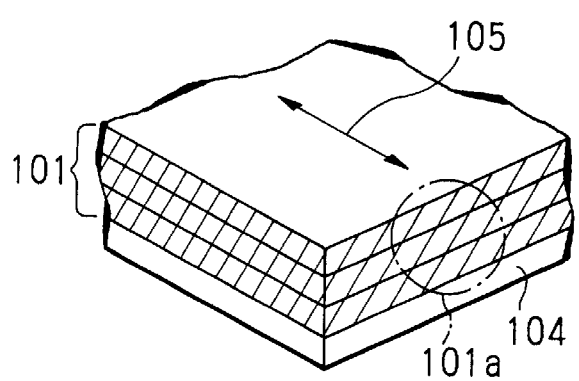
Figure 1C:
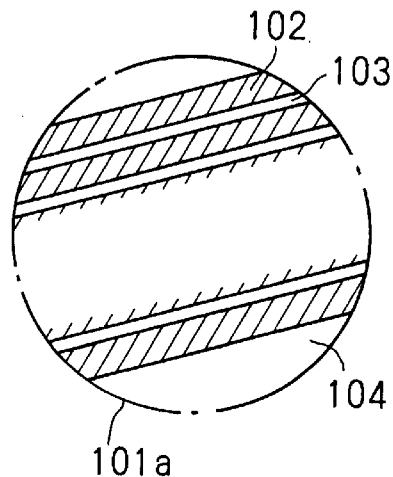

FIGS. 1A, 1B, and 1C show a first embodiment of an electromagnetic noise absorbing material in accordance with the present invention. Electromagnetic noise absorbing material 101 is provided with a film-shaped alloy magnetic material 102, and the thickness of this alloy magnetic material 102 has a value within a range of from $\frac{1}{10}$ to 10 times the skin depth thereof. Furthermore, in alloy magnetic material 102, uni-axial magnetic anisotropy 105 is present in a direction parallel to the surface of the film. FIG. 1A shows the case in which the alloy magnetic material 102 has one layer, while FIGS. 1B and 1C (FIG. 1C is a partially expanded view of FIG. 1B) show the case of a multi-layered structure in which a plurality of layers of alloy magnetic material 102 and non-magnetic insulating material 103 are layered alternately; in both cases, it is possible to obtain the same effects. In the multi-layered structure, the thickness of the non-magnetic insulating material 103 is such as to maintain electrical insulation between each alloy magnetic material 102, or more. In FIGS. 1A, 1B, and 1C, a sheet substrate 104 comprising a non-magnetic insulating material is used to support the electromagnetic noise absorbing material 101. In the case in which the sheet substrate 104 is present, or in the case in which it is not present, identical effects can be obtained.

Figure 2:
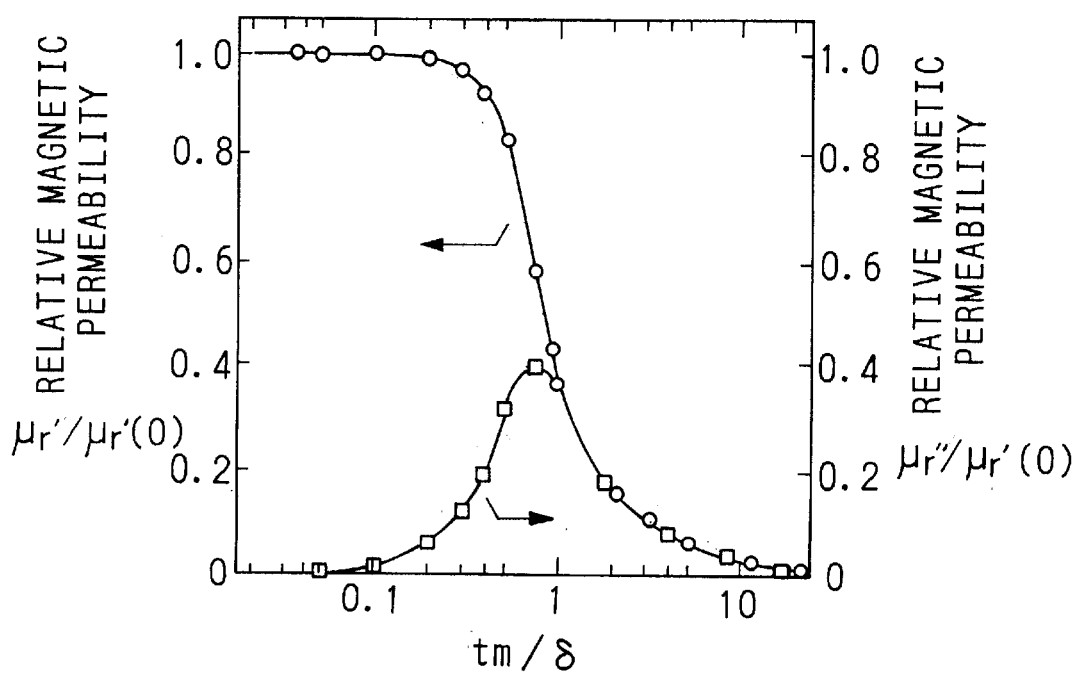
FIG. 2 shows the dependency of relative magnetic permeability on the thickness of the alloy magnetic substance film.

In FIG. 2, the relationship between an alloy magnetic material film thickness $t_m$ and the relative magnetic permeability $\mu_r$ (see Formula (1)) is shown. The relative magnetic permeability represents the value in the direction of the hard axis. NiFe and CozrNb were employed as the alloy magnetic materials. In FIG. 2, $\mu_r'$ and $\mu_r''$ are normalized by static relative magnetic permeability $\mu_r'(0)$, while $t_m$ is normalized by skin depth $\delta$. Using the electrical resistivity $\rho_m$ of the alloy magnetic material, $\mu_r'(0)$, frequency f, and the magnetic permeability $\mu_0$ in a vacuum, the value of $\delta$ is given by the following Formula:

$$\delta = [2\rho_m/(2\pi f \cdot \mu_r'(0) \cdot \mu_0)]^{1/2} \qquad (3)$$

In the case of NiFe, $\mu_r'(0)=3000$, and $\rho_m=20\ \mu\Omega\text{cm}$, while in the case of CoZrNb, $\mu_r'(0)=3000$, and $\rho_m=120\ \mu\Omega\text{cm}$. As shown in FIG. 2, when $t_m/\delta$ is within a range from 0.1 to 10, $\mu_r''$ has a value which is equal to or greater than $\frac{1}{100}$ of the maximum value of $\mu_r''$. When $t_m$ is less than $\frac{1}{10}$ of $\delta$, and when $t_m$ exceeds 10 times $\delta$, an electromagnetic noise suppression effect which is larger than that of the conventional electromagnetic noise absorbing material (ferrite magnetic substance) cannot be realized by the electromagnetic noise absorbing material of the present invention, so that it is not preferable that the electromagnetic noise absorbing material of the present invention be applied under such circumstances. From this, it was understood that it is effective to set the value of $t_m$ within a range of from $\frac{1}{10}$ to 10 times that of $\delta$.

Figure 3A:
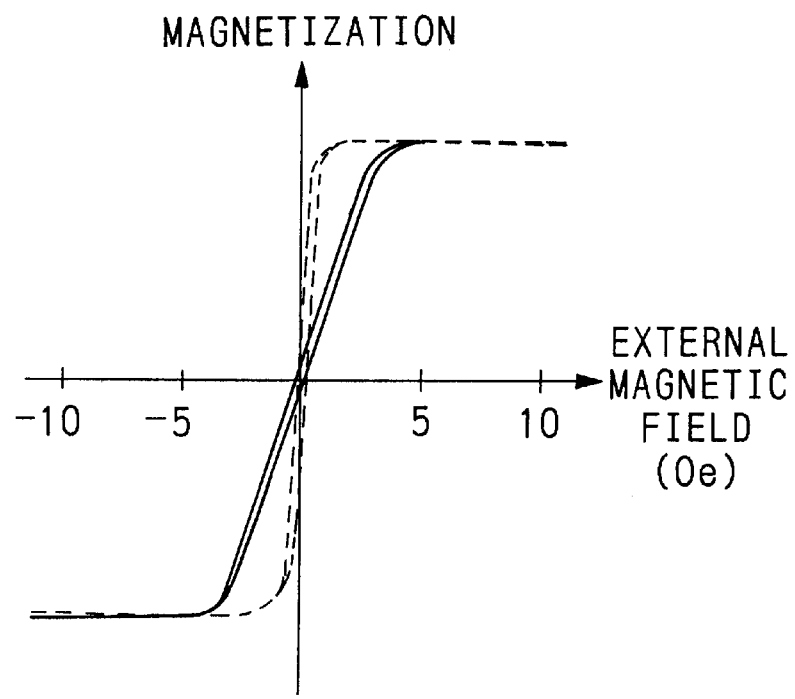
FIGS. 3A and 3B show the magnetization curves.
Figure 3B:
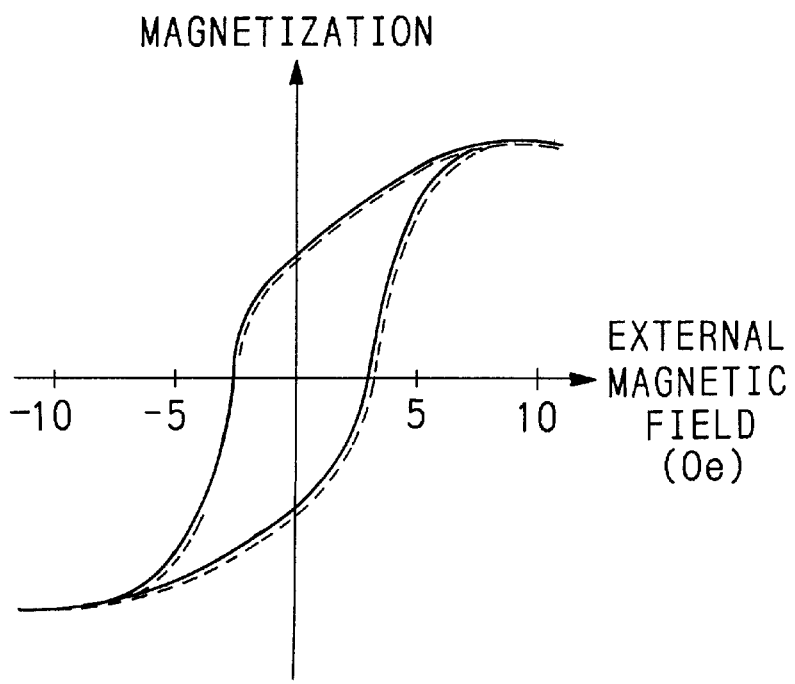

The alloy magnetic substance has uni-axial magnetic anisotropy within the film surface thereof, as shown in FIG. 1A. The magnetization curve of the alloy magnetic material in which uni-axial magnetic anisotropy is present in the film surface is shown in FIG. 3A, while that in which such anisotropy is not present is shown in FIG. 3B. The solid line and the dashed line are magnetization curves with respect to two perpendicular directions. In the case shown in FIG. 3A, the solid line corresponds to the hard axis direction, while the dotted line corresponds to the easy axis direction. Here, a NiFe film was used as the alloy magnetic material. In FIG. 3A, superior soft magnetic characteristics having small hysteresis were obtained; however, in FIG. 3B, large hysteresis was present, and in this case, a large relative magnetic permeability could not be obtained. The electromagnetic noise suppression effect of the electromagnetic noise absorbing material is in proportional relationship to the relative magnetic permeability of the alloy magnetic material. Accordingly, in order to obtain a large relative magnetic permeability, the provision of uni-axial magnetic anisotropy in the film surface in the alloy magnetic material is effective. Only the magnetization process of the hard axis direction responds to high frequency magnetic fields in which the frequency is on the level of a few MHz or more. In FIG. 3B there is no anisotropy, so that neither the solid line nor the dotted line are effective with respect to high frequency magnetic fields. The dotted line in FIG. 3A indicates the direction of the easy axis, so that this also not effective. Only the solid line of FIG. 3A is effective. From the point of view of being applicable to high frequency electromagnetic noise, as well, it can be said that it is effective to provide uni-axial magnetic anisotropy in the film surface in the alloy magnetic material, as in FIG. 3A.

Figure 4:
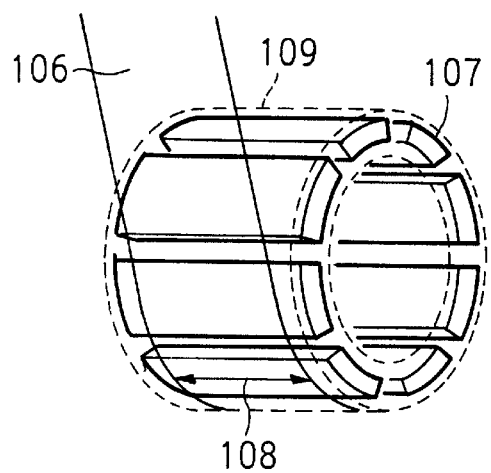
FIG. 4 shows a method for applying an external magnetic field to the film surface of the alloy magnetic substance.

Examples of a method for applying uni-axial magnetic anisotropy within the film surface to an alloy magnetic material include a method in which an external magnetic field is impressed in a direction within the film surface of the alloy magnetic material, during the manufacturing of the alloy magnetic material. An example of a method for impressing an external magnetic field in the film surface of an alloy magnetic material is, for example, as shown in FIG. 4, a method using a permanent magnet 107 disposed within a cylindrical can 109. In such a case, the polarity of the external magnetic field direction 108 may be in either direction. Reference numeral 106 indicates the non-magnetic insulating material sheet substrate.

The magnetization curve of a NiFe film manufactured by means of this method is shown in FIG. 3A. It can be seen that a clear uni-axial magnetic anisotropy within the film surface, which makes the external magnetic field direction the easy axis, is applied. Examples of methods for impressing the external magnetic field include a method employing permanent magnets, and a method employing electromagnets; either of these will yield similar effects (see FIGS. 22 and 23A~23D).

Figure 5:
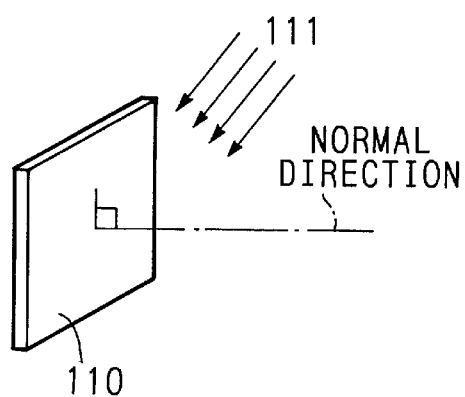
FIG. 5 shows a method for the oblique deposition.

Another example of a method for applying uni-axial magnetic anisotropy within the film surface is a method in which, after the alloy magnetic substance has been produced without an external magnetic field, the temperature of the surface is set to a level at or above that during deposition, and an external magnetic field is impressed in a direction within the film surface of the alloy magnetic substance. Furthermore, another example of a method for applying uni-axial magnetic anisotropy within the film surface is an oblique deposition method. As shown in FIG. 5, this is a method in which an alloy magnetic substance is deposited in an oblique direction on a substrate 110, and thereby, the crystal grain diameter of the alloy magnetic substance is made flake-shaped, and by means of the shape magnetic anisotropy, uni-axial magnetic anisotropy is applied within the film surface. Similar effects can be obtained by any of these methods.

Figure 6:
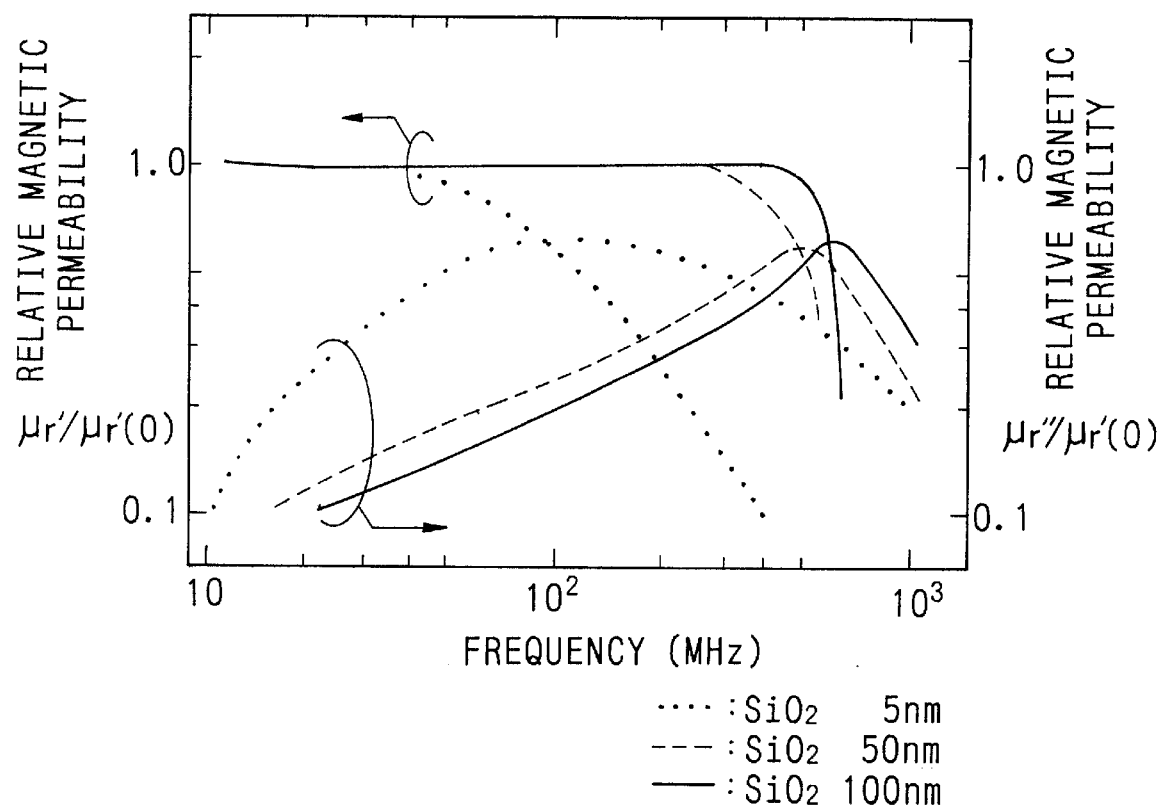
FIG. 6 shows the frequency characteristics of the relative magnetic permeability in the case in which the thickness of the non-magnetic insulating material film is altered.

When the non-magnetic insulating material film layer is thin, breakdowns in electrical insulation occur, and characteristics such as those shown in FIG. 2 are unobtainable. In FIG. 6, the frequency characteristics of the relative magnetic permeability are shown in the case in which a NiFe film was used as the alloy magnetic substance, a $SiO_2$ film was used as the non-magnetic insulating substance, and the thickness of the $SiO_2$ film was altered. The relative magnetic permeability indicates a value in the hard axis direction. The thickness of the NiFe film was set to 50 nm (0.05 $\mu$m), which is sufficiently thinner than the skin depth of NiFe in this frequency band, which is 0.16–1.6 $\mu$m. When the thickness of the $SiO_2$ film is 5 nm, there are electrical insulating deficiencies, and as a result of this, from approximately 30 MHz, $\mu_r'$ is reduced, while $\mu_r''$ increases. On the other hand, when the thickness of the $SiO_2$ film is 50 nm, the value of $\mu_r'$ is stable until the ferromagnetic resonance frequency 650 MHz of the NiFe film, and the electrical insulation is essentially maintained, and furthermore, when the thickness of the $SiO_2$ film is 100 nm, the insulation effect becomes further reliable. From the above, it can be seen that in the case in which $SiO_2$ film is used as the non-magnetic insulating substance, the setting of the thickness of the non-magnetic insulating substance film at a level of 50 nm or more is effective for maintaining the electrical insulation between alloy magnetic substances. It is preferable that the upper limit of the thickness of the non-magnetic insulating material film be 10 mm or less from the point of view of application.

Concrete embodiments will be discussed hereinbelow. Using CoZrNb as the alloy magnetic substance, $SiO_2$ as the non-magnetic insulating substance, and PET having a thickness of 6 $\mu$m as the non-magnetic insulating substance tape substrate, manufacturing was conducted by means of the ion beam sputtering method. The sputtering conditions were set such that the operational vacuum degree was Ar $1\times10^{-4}$ Torr, the acceleration voltage was 1 kV, and the substrate temperature was within a range of from room temperature to 160° C. An external magnetic field was impressed by means of permanent magnets. The uni-axial anisotropic magnetic field within the film surface of the CozrNb during deposition was 20 Oe, so that, as a result of heat treatment in a rotating magnetic field, this was reduced to a level of 3 Oe. The value of $\mu_r'(0)$ in the direction of the hard axis was 3000, while the value of $\rho_m$ was 120 $\mu\Omega$cm. The thickness of the CoZrNb film was 2.0 $\mu$m, which fulfilled the condition of being within a range of $\delta/10$ to $10\delta$, and the thickness of the $SiO_2$ film was set to 0.1 $\mu$m, which made it possible to maintain electrical insulation.

Figure 7:
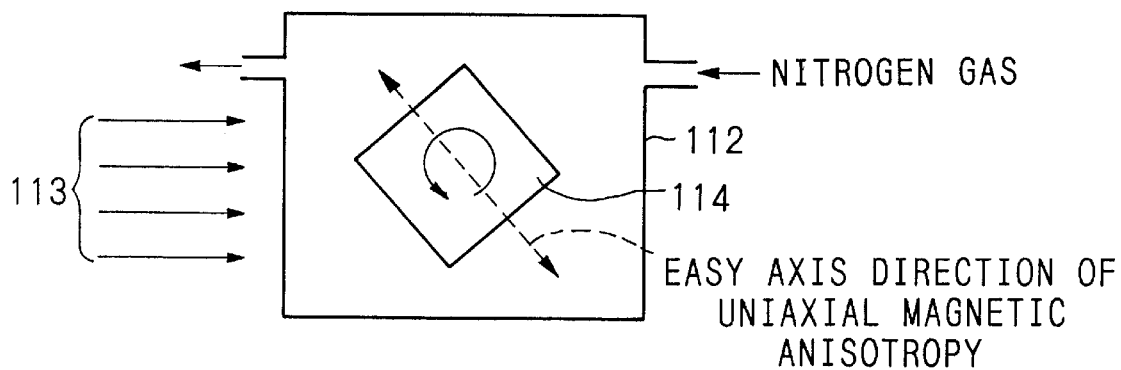
FIG. 7 shows a method for conducting heat treatment in a rotating magnetic field.

In the heat treatment in a rotating magnetic field, a heat treatment method was employed in which, for example, as shown in FIG. 7, in an electric furnace 112, an external magnetic field 113 is impressed parallel to the film surface of the alloy magnetic substance, the noise absorbing substance 114 is rotated about an axis comprising a direction perpendicular to the film surface of the alloy magnetic substance, and setting is conducted so that the direction of the uni-axial magnetic anisotropy of the alloy magnetic substance and the direction of the external magnetic field vary with the passage of time. The heat treatment was conducted in a nitrogen gas atmosphere, and the heat treatment temperature was 350° C., the period of heat treatment was 1 hour, the strength of the external magnetic field was 100 Oe, and the rotational speed was 4 rpm.

Figure 8:
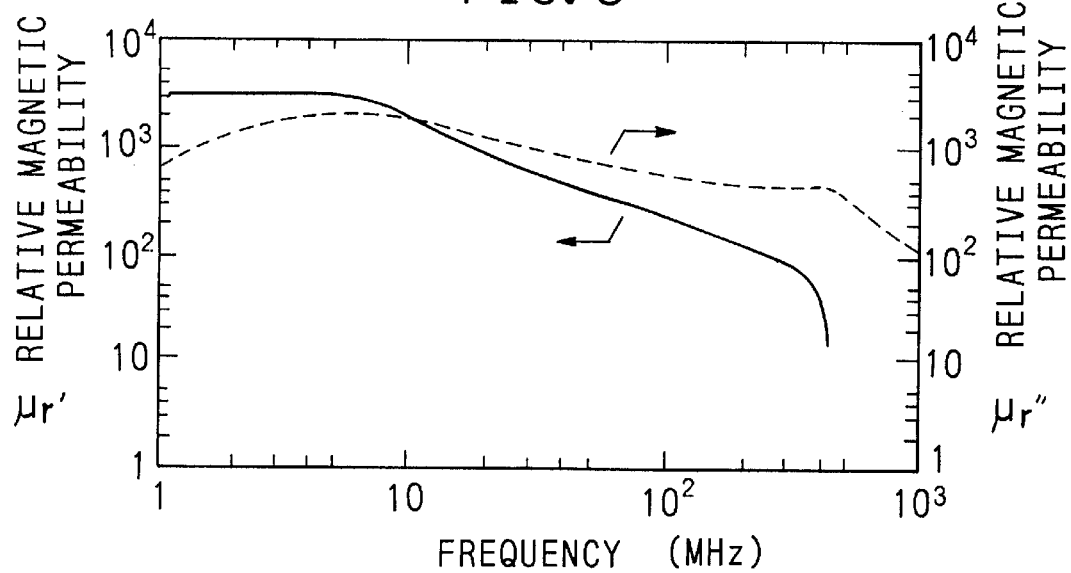
FIG. 8 shows the frequency characteristics of the relative magnetic permeability.
Figure 37:
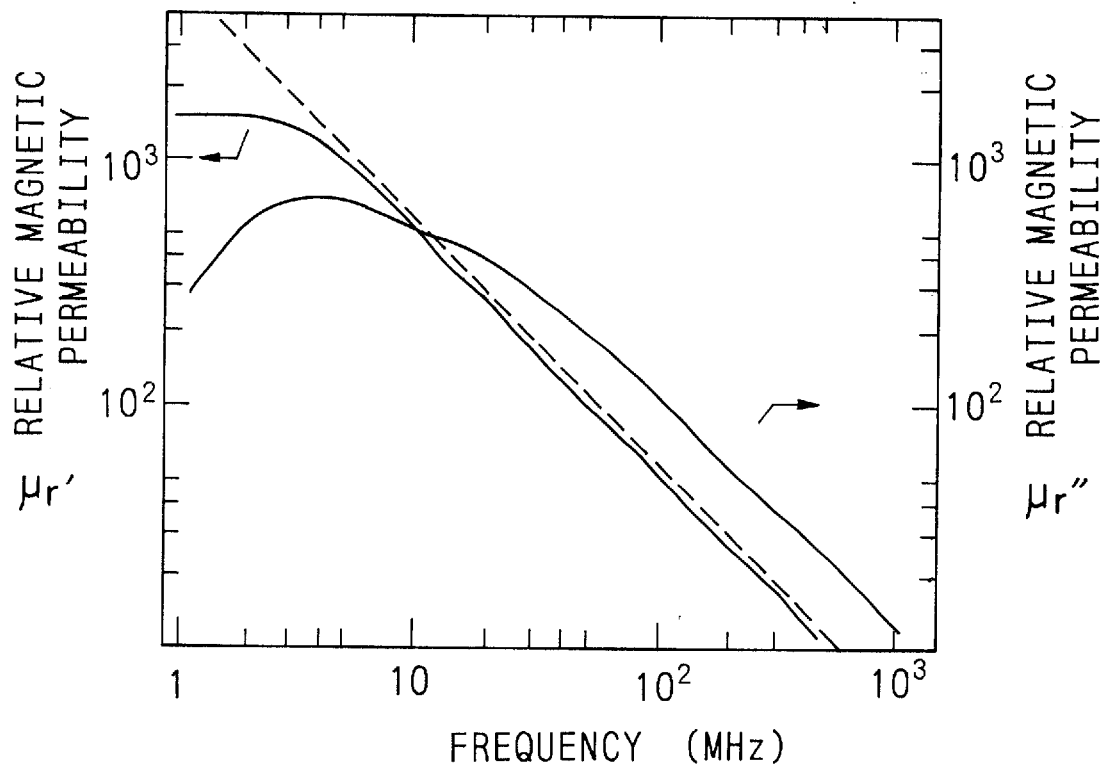
FIG. 37 shows the frequency characteristics of the relative magnetic permeability in a conventional electromagnetic noise absorbing material (ferrite magnetic substance).
Figure 38:
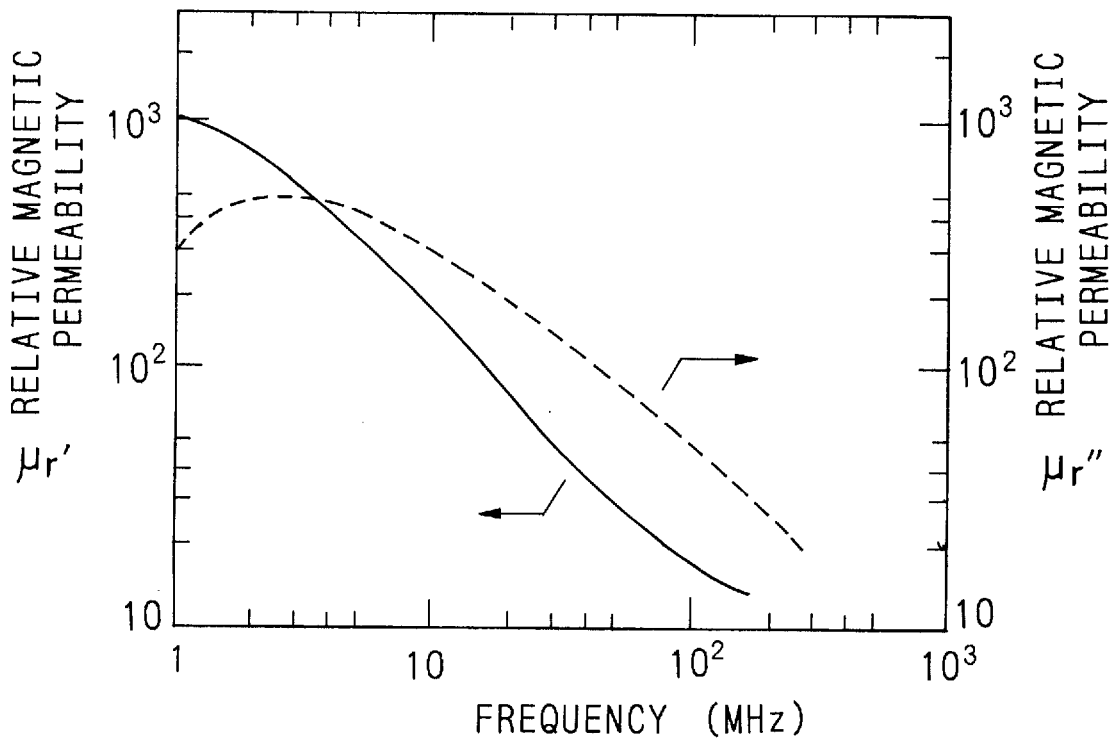
FIG. 38 shows the frequency characteristics of the relative magnetic permeability in a conventional ferrite magnetic substance (Mn—Zn ferrite).

In FIG. 8, the frequency characteristics of the relative magnetic permeability in the direction of the hard axis are shown. At levels of 10 KHz or more, $\mu_r''$ is greater than $\mu_r'$, and the values of $\mu_r'$ and $\mu_r''$ are much larger in comparison with those of the ferrite magnetic substance of FIGS. 37 and 38. As is clearly shown in this diagram, a large $\mu_r''$ value is maintained even at levels of a few hundred MHz or more, so that such an electromagnetic noise absorbing material is effective even with respect to electromagnetic noise of a few hundred brHz.

Next, using NiFe as the alloy magnetic substance, $SiO_2$ as the non-magnetic insulating substance, and PEN having a thickness of 6 $\mu$m as the non-magnetic insulating substance tape substrate, an embodiment in which manufacturing was conducted by means of a vapor deposition method will be described. The substrate temperature was set within a range of from room temperature to 160° C., and the external magnetic field was impressed by means of electromagnets. The magnetically anisotropic magnetic field uni-axial within the film surface had a strength of 3 Oe, and the value of $\mu_r'(0)$ in the direction of the hard axis was 3000, while the value of $\rho_m$ was 20 $\mu\Omega$cm. The thickness of the NiFe film was 1.5 $\mu$m, which fulfilled the condition that this thickness be within a range of $\delta/10$ to $10\delta$, and the $SiO_2$ film thickness was set to 0.1 μm, which was capable of maintaining the electrical insulation.

Figure 9:
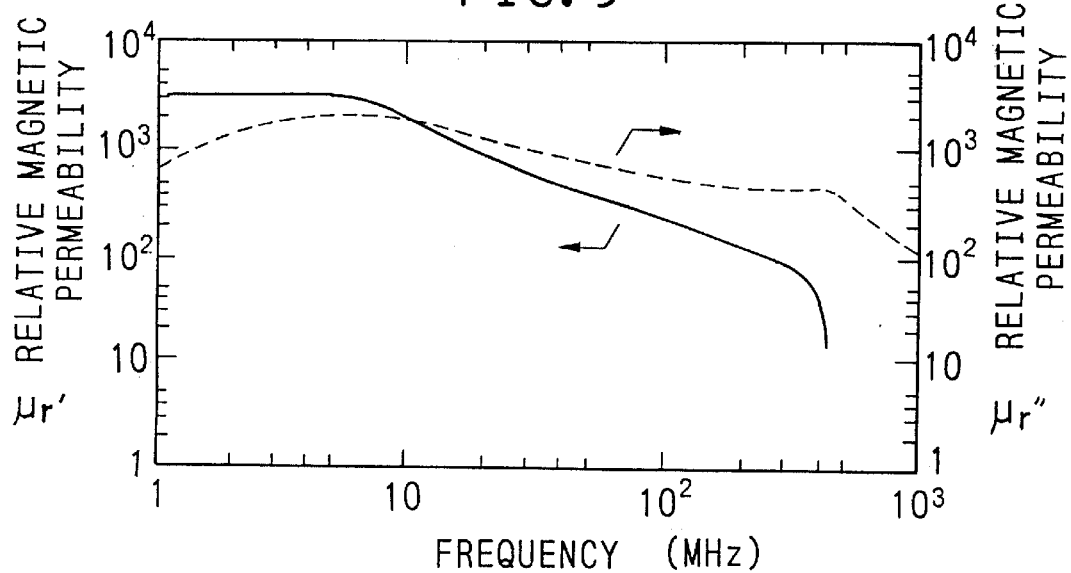
FIG. 9 shows the frequency characteristics of the relative magnetic permeability.

The frequency characteristics of relative magnetic permeability in the direction of the hard axis are as shown in FIG. 9. At a level of 10 MHz or more, $\mu_r''$ is greater than $\mu_r'$, and the values of $\mu_r'$ and $\mu_r''$ are much larger than those in the case of the ferrite magnetic substance shown in FIGS. 37 and 38. Furthermore, as is clear from the Figure, a large value of $\mu_r''$ is maintained even at levels of a few hundred MHz or more, so that it was learned that such a noise absorbing material was effective even with respect to noise of a few hundred tHz.

Examples of manufacturing methods for the noise absorbing material of the present invention include the ion beam sputtering method, the RF sputtering method, the magnetron sputtering method, the vapor deposition method, and the like; any of these methods are capable of obtaining similar effects.

It is possible to use magnetic materials employing Fe, Co, or Ni as a base as the alloy magnetic substance, and it is possible to use $SiO_2$, AlN, $Al_2O_3$, BN, TiN, SiC, polyethylene naphthalate (PEN), polyethylene teraphthalate (PET), polyimides, captone, or photoresists as the non-magnetic insulating substance tape substrate; it is possible to achieve the same effects with any of the above.

In addition to the above, the following may be employed as the alloy magnetic substance.

(NiFeMo, NiFeCu, NiFeCr, NiFeNb, NiFeTi, NiFeSi, FeSi, FeC, FeN, CoFe, FeSiAl, FeB, FeBSi, CoBSi, FeCoBSi, FeCoNiBSi, $COX_a[X_a$: Y, Zr, Hf, Ti, Nb, Mo, W, Re, Ni, Fe, Mn] $COX_bX_c[X_b$: Y, Zr, Hf, Ti, Nb, Mo, W, Re, Ni, Fe, Mn, $X_c$: Y, Zr, Hf, Ti, Nb, Mo, W, Re, Ni, Fe, Mn])

Figure 10:
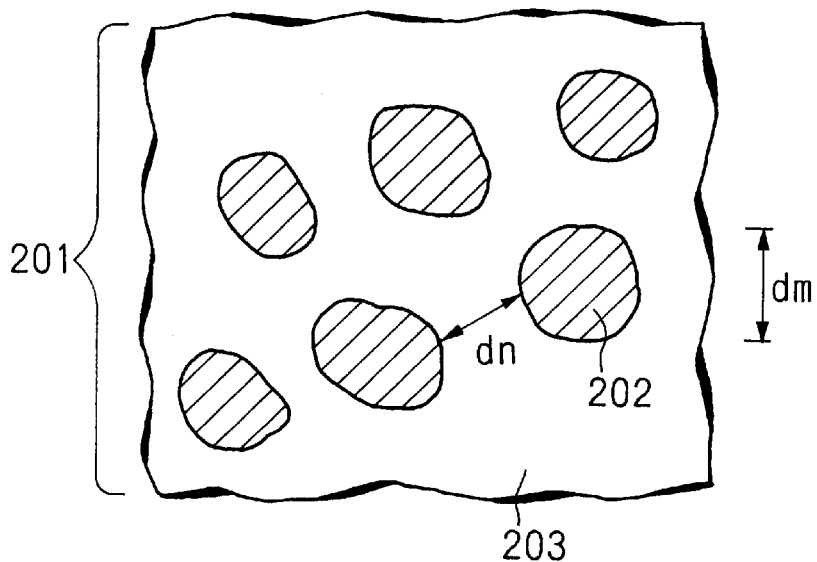
FIG. 10 shows a structural example of a second embodiment of an electromagnetic noise absorbing material in accordance with the present invention.

Section 2: Second Embodiment of the Electromagnetic Noise Absorbing Material FIG. 10 shows a second embodiment of the electromagnetic noise absorbing material in accordance with the present invention; electromagnetic noise absorbing material 201 possesses a particle type alloy magnetic substance 202, and the particle diameter of the alloy magnetic substance 202 is within a range of from 1/10 to 10 times the skin depth. One or more of the particles of the alloy magnetic substance 202 are dispersed in the non-magnetic insulating substance 203. The particles of the alloy magnetic substance 202 are dispersed with distances therebetween such as to permit the maintenance of electrical insulation.

Examples of the manufacturing method include, for example, the ion beam sputtering method, the RF sputtering method, the magnetron sputtering method, the vapor deposition method, the roll method, the coating method, the screen printing method, and a method in which alloy magnetic substance particles are mixed into a non-magnetic insulating substance paste; identical effects can be achieved by any of the above.

For example, in the case of the ion beam sputtering method, the sputtering conditions are such that the operational vacuum degree is Ar $1\times10^{-4}$ Torr, the acceleration voltage is 1 kV, and the substrate temperature is within a range of from room temperature to 160° C. As the target, a composite target of a CoZr amorphous alloy (for example, CoZrNb[87, 5, 8, at. %]) and $SiO_2$, or a composite target of NiFe alloy (82.5, 17.5 at. %) and $SiO_2$ may be employed, and glass (Corning No. 0211) is used as the substrate. In order to obtain a large relative magnetic permeability, in the case in which NiFe is used, film formation is conducted in a magnetic field by impressing a magnetic field of approximately 100 Oe (see FIG. 4), while in the case in which CoZr amorphous alloy is used, after film formation in a magnetic field, heat treatment was conducted in a rotating magnetic field (see FIG. 7).

Figure 11:
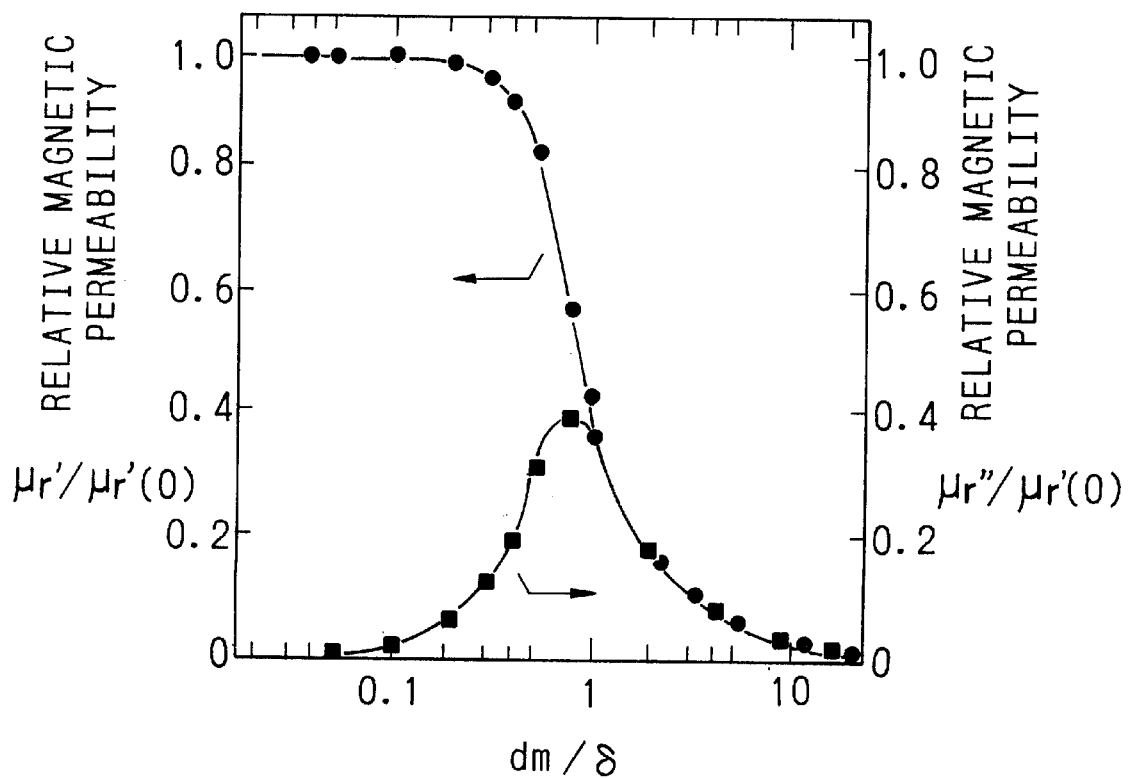
FIG. 11 shows the dependency of the relative magnetic permeability on magnetic material particle diameter.

In FIG. 11, the relationship between the particle diameter $d_m$ of the alloy magnetic substance and the relative magnetic permeability $\mu_r$ (see formula (1)) is shown. NiFe and CoZrNb were used as the alloy magnetic substance, and $SiO_2$ was used as the non-magnetic insulating substance, and the distance between alloy magnetic substances was 0.1 μm. In FIG. 11, $\mu_r'$ and $\mu_r''$ were normalized by static relative magnetic permeability $\mu_r'(0)$ while $d_m$ was normalized by skin depth δ. In the case of NiFe, the value of $\mu_r'(0)$ was 2500, while the value of $\rho_m$ was 20 μΩcm, and furthermore, in the case of CoZrNb, the value of $\mu_r'(0)$ was 5000, while the value of $\rho_m$ was 120 μΩcm. As shown in FIG. 11, when $d_m/δ$ was within a range of from 0.1–10, the value of $\mu_r''$ was maintained at a level of 1/100 that of the maximum value thereof or more. When $d_m$ becomes less than 1/10 of δ, and when $d_m$ exceeds 10 times the value of δ, the electromagnetic noise absorbing material of the present invention is incapable of realizing a electromagnetic noise suppression effect which is larger than that of the conventional electromagnetic noise absorbing material (ferrite magnetic substance), so that the application thereof is not preferable. It can be understood from this that it is effective to set the thickness of $d_m$ to within a range of from 1/10 to 10 times that of δ.

Figure 12:
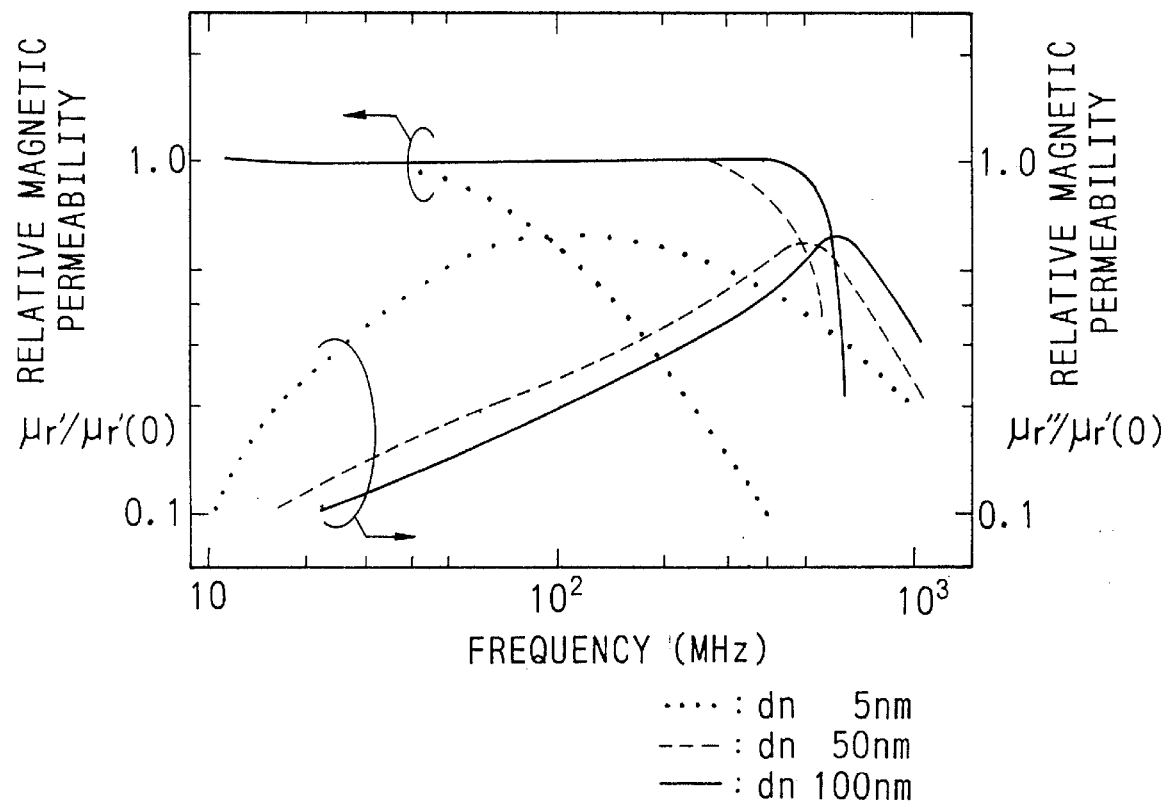
FIG. 12 shows the frequency characteristics of the relative magnetic permeability in the case in which the distance between particles of the alloy magnetic material is altered.

Next, using NiFe having a $\mu_r'(0)$ value of 2500, and a ρm value of 20 μΩcm as the alloy magnetic substance, and using $SiO_2$ as the non-magnetic insulating substance, the distance $d_n$ between alloy magnetic substances was altered and the frequency characteristics of the relative magnetic permeability were measured (see FIG. 12). The value of $d_m$ was set to 50 nm (0.05 μm), which is sufficiently thinner than the skin depth of NiFe, 0.16–1.6 μm, in this frequency band. When $d_n$ has a value of 5 nm, from the vicinity of 30 MHz, the value of $\mu_r'$ declines, while the value of $\mu_r''$ increases, as a result of electrical insulation deficiencies. On the other hand, when the value of $d_n$ is 50 nm, the value of $\mu_r'$ is stable up to the ferromagnetic resonance frequency, 650 MHz, of NiFe, and the electrical insulation is essentially maintained, and furthermore, when $d_n$ has a value of 100 nm, the insulation effect is even further reliable. From the above, it was learned that in the case in which $SiO_2$ is used as the non-magnetic insulating material, it is effective, from the point of view of maintaining the electrical insulation between alloy magnetic substances, if the distance between the alloy magnetic substances is 50 nm or more. It is preferable that the upper limit of the distance between alloy magnetic substances be 10 mm or less from the point of view of application.

Figure 13:
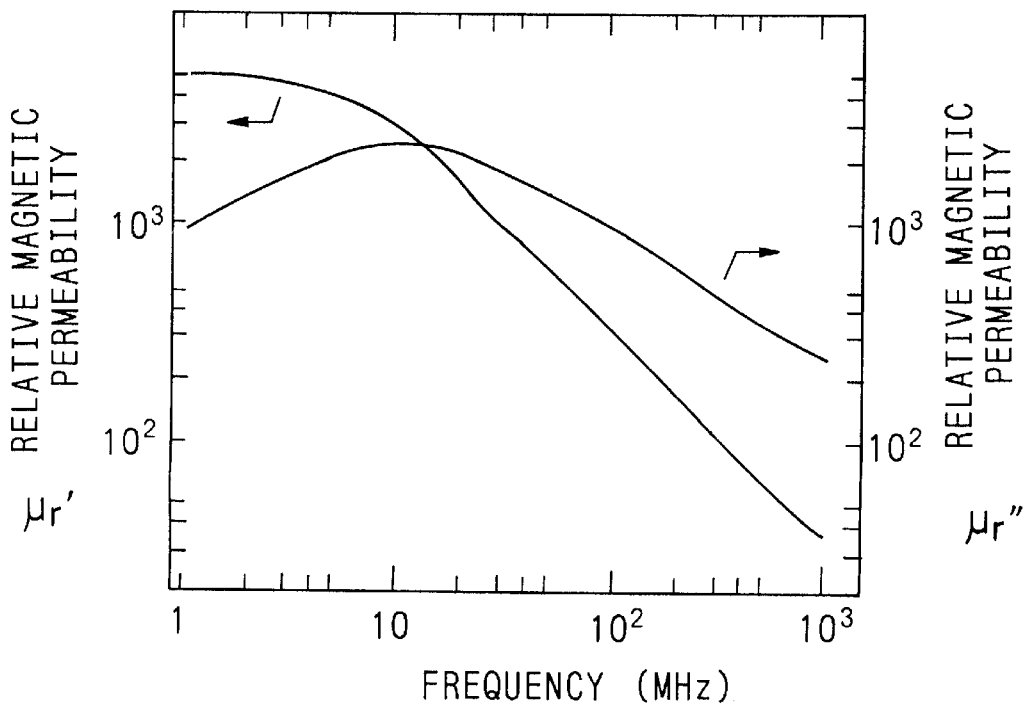
FIG. 13 shows the frequency characteristics of the relative magnetic permeability.

Concrete embodiments will be described hereinbelow. The frequency characteristics of the relative magnetic permeability in the case in which CozrNb having a value of $\mu_r'(0)$ of 5000 and having a value of $\rho_m$ of 120 μΩcm is used as the alloy magnetic substance, and $SiO_2$ is used as the non-magnetic insulating substance, are shown in FIG. 13. Here, the value of $d_n$ was set to 0.1 μm, while the value of $d_m$ was set to 2 μm, which lies within the range of from δ/10 to 10δ. At levels of 10 MHz or more, $\mu_r''$ is greater than $\mu_r'$, and furthermore, the values of $\mu_r$ and $\mu_r''$ are much larger than those in the ferrite magnetic substance shown in FIGS. 37 and 38. As is further clear from the Figure, a large value of $\mu_r''$ is maintained even at levels of a few hundred MHz or more, so that such a electromagnetic noise absorbing material is effective even with respect to electromagnetic noise of a few hundred MHz.

Magnetic materials having Fe, Co, or Ni as a base may be used as the alloy magnetic substance, and $SiO_2$, AlN, $Al_2O_3$, BN, TiN, SiC, polyethylene naphthalate (PEN), polyethylene teraphthalate (PET), polyimide, captone, or photoresist may be employed as the non-magnetic insulating material; similar effects can be obtained with any of the above.

In addition to the above, the following may be employed as the alloy magnetic substance.

(NiFeMo, NiFeCu, NiFeCr, NiFeNb, NiFeTi, NiFeSi, FeSi, FeC, FeN, CoFe, FeSiAl, FeB, FeBSi, CoBSi, FeCoBSi, FeCoNiBSi, $COX_a[X_a$: Y, Zr, Hf, Ti, Nb, Mo, W, Re, Ni, Fe, Aln] $CoX_bX_c[X_b$: Y, Zr, Hf, Ti, Nb, Mo, W, Re, Ni, Fe, Mn, $X_c$: Y, Zr, Hf, Ti, Nb, Mo, W, Re, Ni, Fe, Yn])

Section 3: First Embodiment of the Electromagnetic Noise Filter

Figure 14:
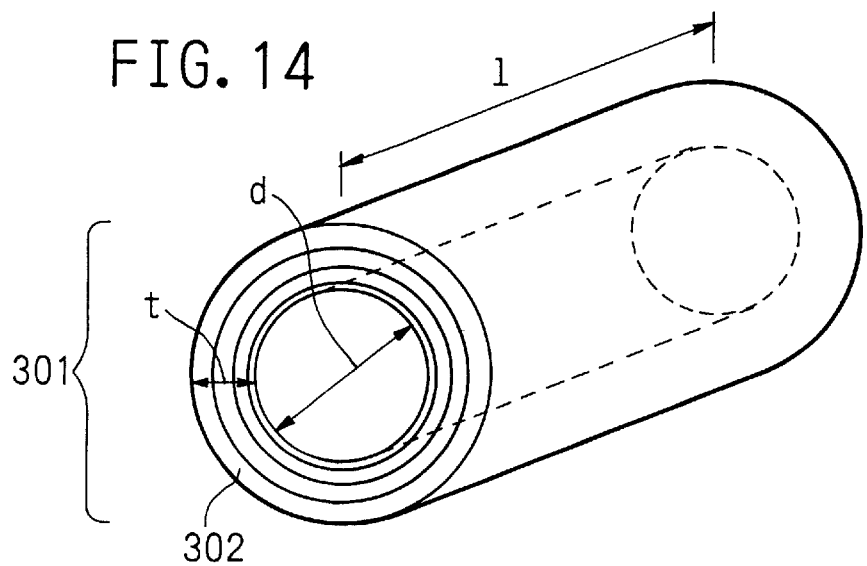
FIG. 14 shows a structural example of a first embodiment of an electromagnetic noise filter in accordance with the present invention.
Figure 15A:
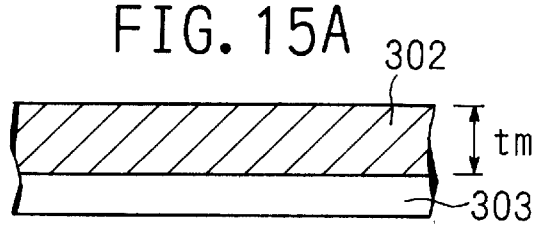
FIGS. 15A and 15B are partial views showing examples in which a non-magnetic insulating substance is bonded to the electromagnetic noise absorbing material of the electromagnetic noise filter of FIG. 14.
Figure 15B:
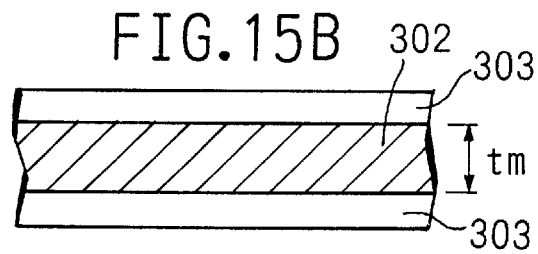
Figure 16A:
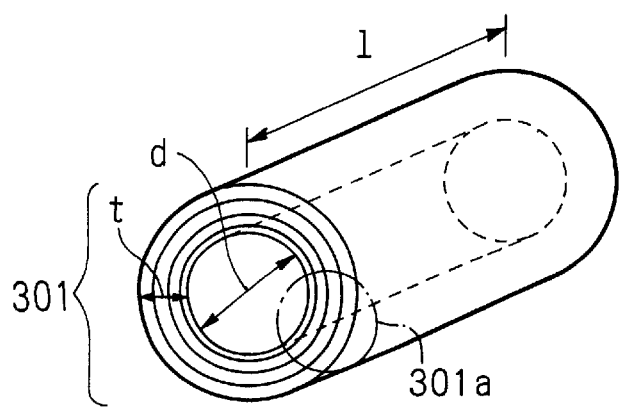
FIGS. 16A and 16B show another structural example of the first embodiment of the electromagnetic noise filter in accordance with the present invention.
Figure 16B:
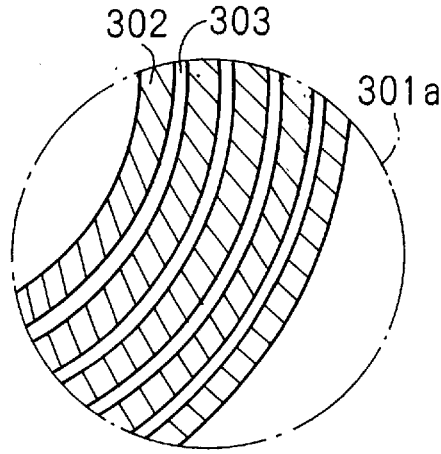

FIG. 14 shows a first embodiment of an electromagnetic noise filter in accordance with the present invention; this electromagnetic noise filter 301 is constructed by winding one or more layers of the electromagnetic noise absorbing material 302 described above in a tube shape. FIGS. 15A and 15B show examples in which a non-magnetic insulating material 303 is bonded to one side (FIG. 15A) or both sides (FIG. 15B) of a electromagnetic noise absorbing substance 302; in, for example, the case in which one or more layers of the structure shown in FIG. 15A are wound in a tube shape, the structure shown in FIG. 16A is obtained. FIG. 16B shows an expanded view of the part labeled 301a. Similar effects can be achieved by any of the above methods.

Hereinbelow, a concrete example, in which a electromagnetic noise absorbing material in accordance with the First Embodiment (FIG. 1B) is employed, will be explained. Manufacturing was conducted by means of an ion beam sputtering method, and the sputtering conditions were such that the operational vacuum degree was Ar $1\times10^{-4}$ Torr, the acceleration voltage was 1 kV, and the temperature of the substrate was within a range of from room temperature to 160° C. In the target, a CoZr amorphous alloy (for example, CoZrNb [87, 5, 8, at. %]), or a NiFe alloy (82.5, 17.5, at. %) was used as the alloy magnetic substance, and $SiO_2$ was used as the non-magnetic insulating substance, and glass (Corning No. 0211) was used as the substrate. In order to obtain a large relative magnetic permeability, in the case in which NiFe was used, film formation was conducted in a magnetic field by impressing a magnetic field of approximately 100 oe (see FIGS. 4, 22, and 23A–23D), while, in the case in which a CoZr amorphous alloy was employed, after film formation in a magnetic field, heat treatment was conducted in a rotating magnetic field (see FIG. 7).

A method for manufacturing the cylindrical electromagnetic noise filter was adopted in which the electromagnetic noise absorbing material manufactured on the substrate was separated from the substrate, and the sheet-form electromagnetic noise absorbing material was rolled into a cylindrical shape. Furthermore, methods for forming this cylindrical shape include, in addition to that stated above, a method in which an electromagnetic noise absorbing material is formed as a film directly on a flexible non-magnetic insulating material sheet, such as, for example, polyimide, and this is rolled into a cylindrical shape.

Examples of manufacturing methods include, for example, the ion beam sputtering method, the RF sputtering method, the magnetron sputtering method, the vapor deposition method, the plating method, the roll method, the coating method, the screen printing method, the rolling method, and the like; similar effects may be obtained with any of the above methods.

Figure 17:
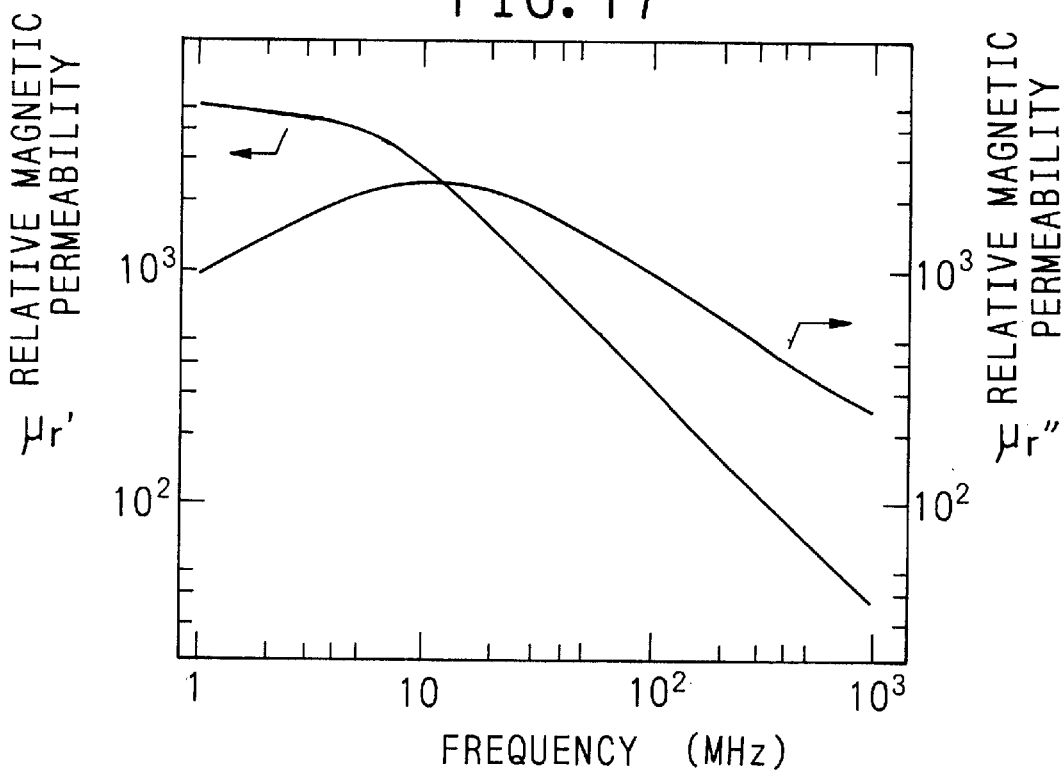
FIG. 17 shows the frequency characteristics of relative magnetic permeability.
Figure 18:
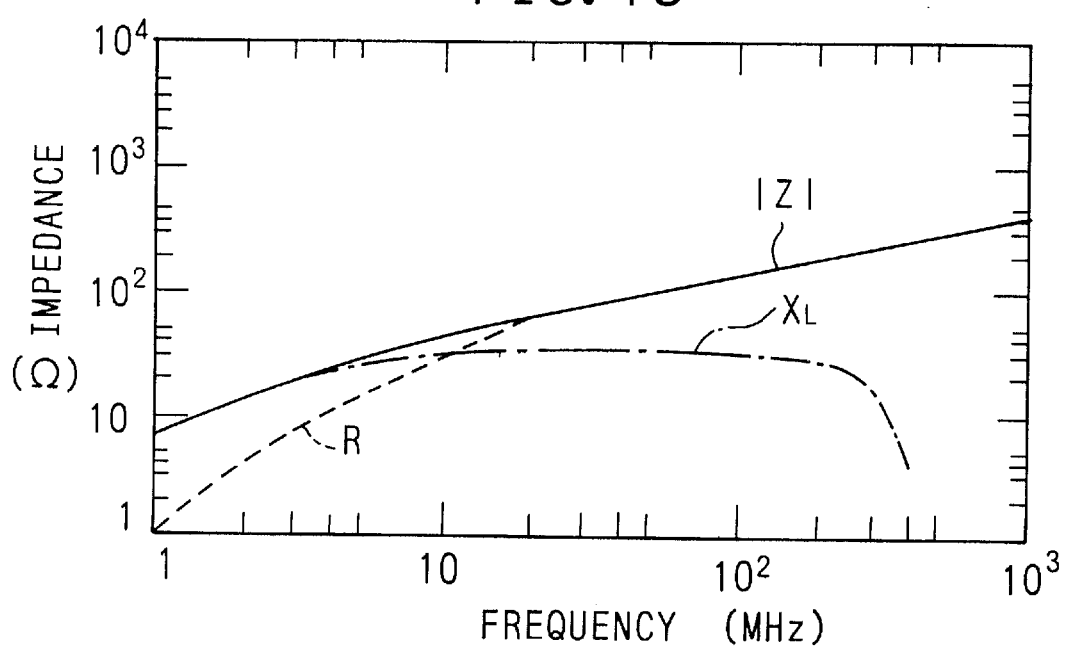
FIG. 18 shows the frequency characteristics of impedance.

The frequency characteristics of the relative magnetic permeability in the case in which CoZrNb having a $\mu_r'(0)$ value of 5000, having a value of $\rho_m$ of 120 $\mu\Omega$cm, and having a value of $t_m$ of 2 $\mu$m was used as the alloy magnetic substance, and $SiO_2$ having a thickness of 0.1 $\mu$m was used as the non-magnetic insulating substance, are shown in FIG. 17. The frequency characteristics of the impedance of an electromagnetic noise filter formed using this as shown in FIG. 16 are shown in FIG. 18. The size of the electromagnetic noise filter was such that d=3 mm, t=60 $\mu$m, and l=10 mm. In the present embodiment, the impedance within a range of 30–1000 MHz ranged from a few tens to 300 $\Omega$, and was thus equivalent to that of the conventional electromagnetic noise filter (ferrite cores) shown in FIG. 41, while being $1/10^2$ of the volume thereof. Furthermore, as is clear from the Figure, there is a large impedance even with respect to a level of a few hundred MHz or more, so that it was learned that such a electromagnetic noise filter is effective even with respect to electromagnetic noise on the level of a few hundred MHz or more.

Next, a concrete example will be explained using a electromagnetic noise absorbing material in accordance with the second embodiment (FIG. 10). A manufacturing method was used which was identical to the manufacturing method of the electromagnetic noise absorbing material of the second embodiment. CoZrNb having a value of $\mu_r'(0)$ of 5000, and a value of $\rho_m$ of 120 $\mu\Omega$cm, was used as the alloy magnetic substance, and $SiO_2$ was used as the non-magnetic insulating substance, and the value of $d_n$ was set to 0.1 $\mu$m. The value of $d_m$ was set to 2 $\mu$m, which was within a range of $\delta/10 < d_m < 10\delta$. The frequency characteristics of the relative magnetic permeability of the electromagnetic noise absorbing material are identical to those shown in FIG. 13.

A method was adopted for the manufacturing of the cylindrical electromagnetic noise filter in which the electromagnetic noise absorbing material which was manufactured on the substrate was separated from the substrate, and this sheet-form material was rolled into a cylindrical shape. Furthermore, examples of other methods for the production of the cylindrical form, include, for example, a method in which the electromagnetic noise absorbing material is directly formed as a film on a flexible non-magnetic insulating material sheet such as polyimide, and this is rolled into a cylindrical shape, a method using electromagnetic noise absorbing material deposited on a cylindrical substrate, a method in which a bulk shape is rout into a cylindrical shape, and a method in which a paste- form electromagnetic noise absorbing material is formed from the beginning in a cylindrical shape.

Figure 19:
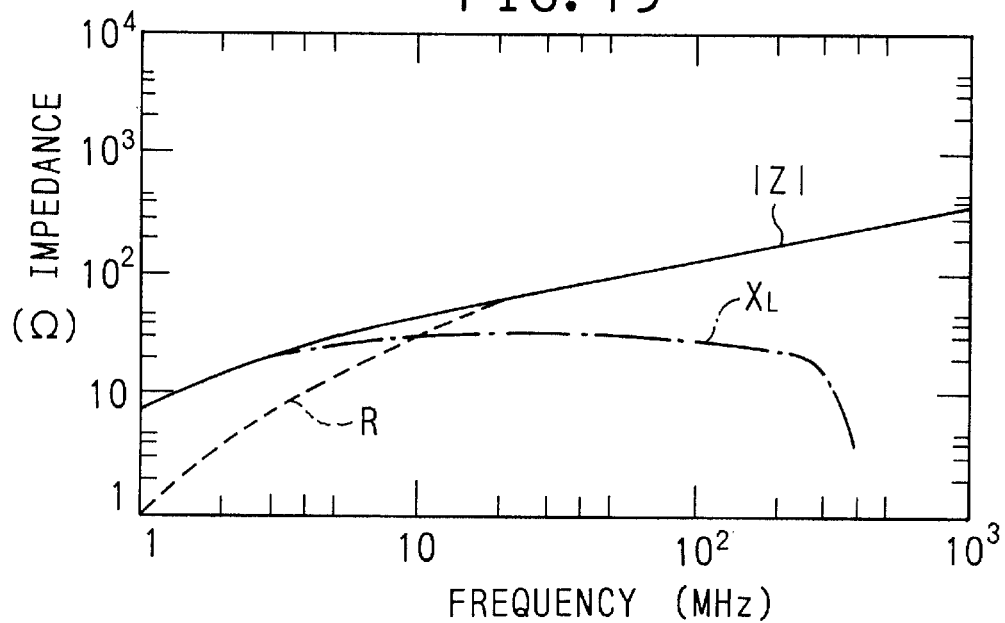
FIG. 19 shows the frequency characteristics of impedance.

The frequency characteristics of the impedance are shown on FIG. 19. In the present embodiment, the impedance within a range of 30–1000 MHz ranges from a few tens to 300 $\Omega$, and is thus equivalent to that of the conventional electromagnetic noise filter (ferrite core) shown in FIG. 41, and the part volume thereof is $1/10^2$ of that which was conventionally obtained. Furthermore, as is clear from the Figure, large impedance is present even with respect to a level of a few hundred MHz or more, so that such an electromagnetic noise filter is effective even with respect to electromagnetic noise of a few hundred MHz or more.

Section 4: Second Embodiment of the Electromagnetic Noise Filter

Figure 20:
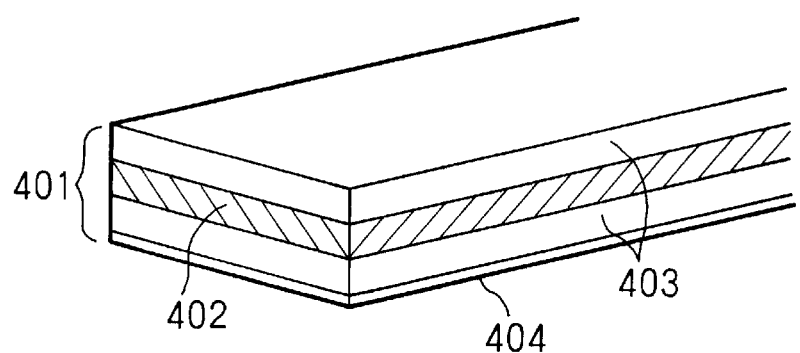
FIG. 20 shows a structural example of an electromagnetic noise filter tape comprising a second embodiment of the electromagnetic noise filter in accordance with the present invention.

FIG. 20 shows the structure of an electromagnetic noise filter tape 401 comprising a second embodiment of an electromagnetic noise filter of the present invention; the electromagnetic noise absorbing material 402 is formed in a tape shape. Non-magnetic insulating substance 403 is bonded to both sides of electromagnetic noise absorbing material 402. Identical effects can be obtained even if non-magnetic insulating substance 403 is bonded to only one surface of electromagnetic noise absorbing material 402.

Figure 21A:
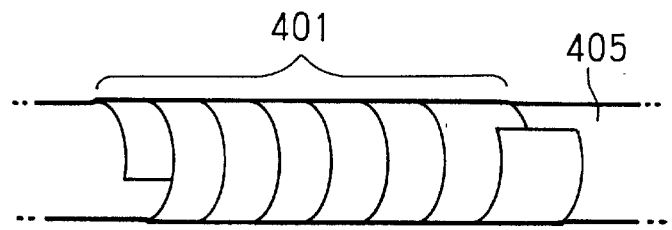
FIGS. 21A and 21B show embodiments of the electromagnetic noise filter tape of FIG. 20 on cables.
Figure 21B:
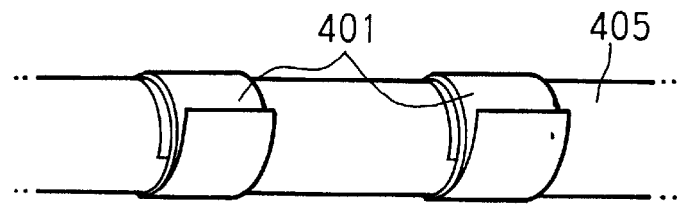

FIGS. 21A and 21B show examples in which the electromagnetic noise filter tape 401 is installed on a cable 405. FIG. 21A shows an installation in which electromagnetic noise filter tape 401 is wound around cable 405 in a spiral manner in the longitudinal direction thereof, while FIG. 21B shows an installation in which electromagnetic noise filter tape 401 is wound around cable 405 at the same position so as to overlap itself. Similar effects can be obtained by both the installations shown in FIGS. 21A and 21B. At this time, the same effects can be obtained if an adhesive 404 is applied to the surface of the non-magnetic insulating substance 403 to which the electromagnetic noise absorbing material 402 is not applied, in the same manner as common adhesive tape, and when adhesive 404 is applied, the attachment on cable 405 becomes more convenient.

Phenol resins, epoxy resins, vinyl resins, acrylate resins, or synthetic rubber may be used as adhesive 404.

In general, it is most effective if the electromagnetic noise filter is installed at the root on the side of the cable signal source (in the vicinity of the connector of the signal source apparatus). Accordingly, it is preferable that the installation position of the electromagnetic noise filter tape, be, insofar as possible, in the vicinity of the root of the side of the signal source of the cable. Furthermore, in FIG. 21B, the electromagnetic noise suppression effect is not dependent on the gap between tapes; however, in consideration of the above, it is effective to install the tapes so as to narrow the gap with the root of the signal source, as far as possible.

Electromagnetic noise absorbing material 402 possesses uni-axial magnetic anisotropy within the film surface, such that, for example, the direction of width of the tape is made the easy axis. The magnetization curve of an electromagnetic noise absorbing material which does possess uni-axial magnetic anisotropy within the film surface is shown in FIG. 3A, while the magnetization curve of an electromagnetic noise absorbing material which does not possess such anisotropy is shown in FIG. 3B; from the point of view of realizing a large electromagnetic noise suppression effect, and being effective with respect to high frequency electromagnetic noise, it is effective to provide uni-axial magnetic anisotropy within the film surface of the electromagnetic noise absorbing material, as shown in FIG. 3A.

At this time, the magnetic component of the electromagnetic noise which is generated from cable 405 is in the circumferential direction of cable 405, so that it is advantageous to provide the easy axis of the electromagnetic noise absorbing material so as to be perpendicular to the circumferential direction of cable 405. For example, in FIG. 21A, the easy axis direction is placed in a direction slightly displaced from the direction of width of the electromagnetic noise filter tape, while in FIG. 21B, setting this direction parallel to the direction of width of the electromagnetic noise filter tape is effective, as it takes advantage of the magnetization process in the direction of the hard axis.

An example of a method for applying uni-axial magnetic anisotropy within the film surface in an electromagnetic noise absorbing material is a method in which an external magnetic field is impressed in a direction within the film surface of the electromagnetic noise absorbing material during the deposition of the electromagnetic noise absorbing material. The magnetization curve of a NiFe film manufactured according to this method is shown in FIG. 3A. In FIG. 3A, clear uni-axial magnetic anisotropy within the film surface is applied so as to make the direction of the external magnetic field the easy axis.

Figure 22:
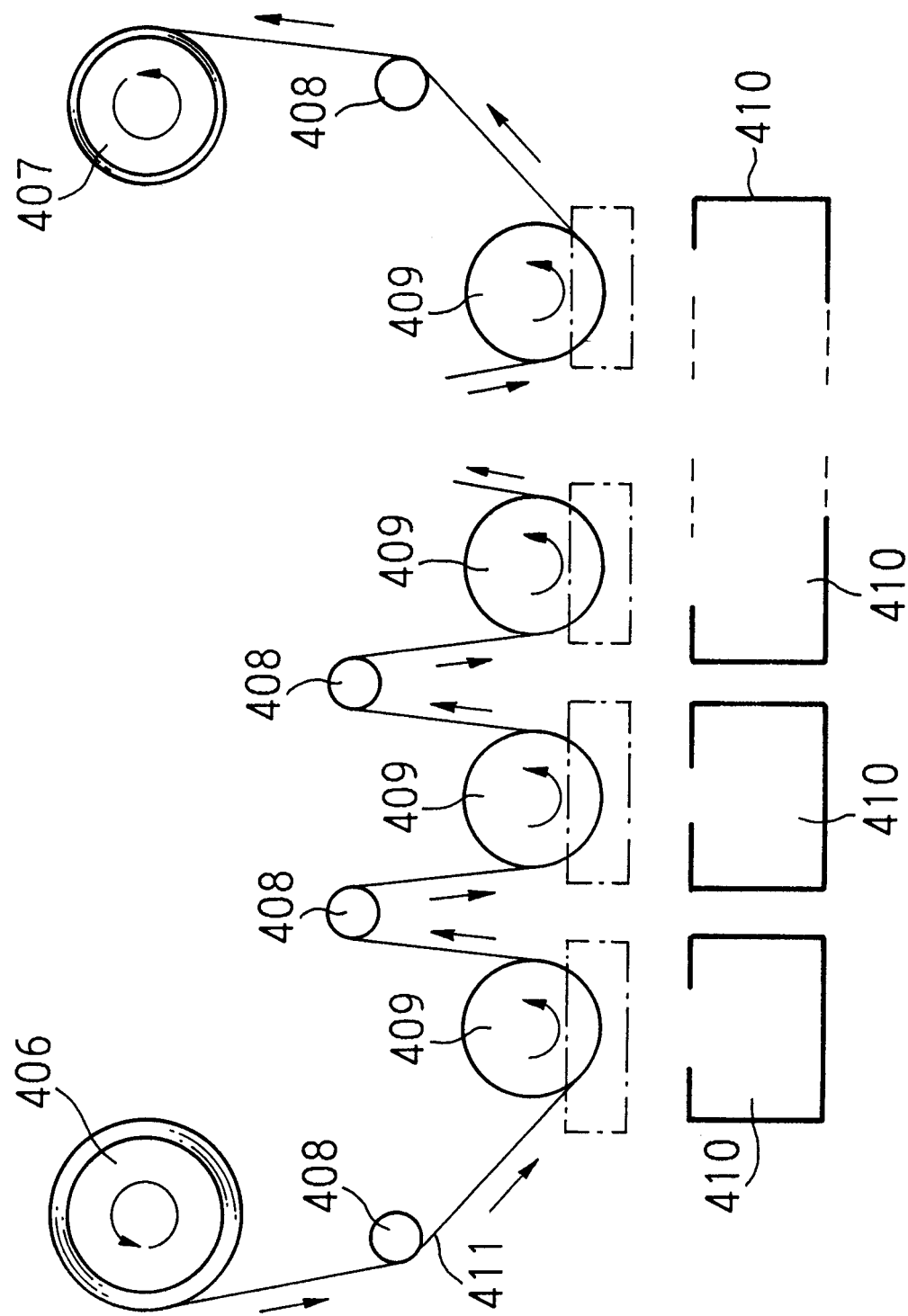
FIG. 22 shows a structural example of a manufacturing apparatus for the electromagnetic noise filter tape comprising a second embodiment of the electromagnetic noise filter in accordance with the present invention.

In FIG. 22, the essential parts are shown of a thin film manufacturing apparatus which is provided with a mechanism for impressing an external magnetic field in a direction within the film surface of an electromagnetic noise absorbing material during the deposition of the electromagnetic noise absorbing material. In FIG. 22, this apparatus comprises a feed bobbin 406, a winding bobbin 407, one or more guide axles 408, cylindrical cans 409, and raw material sources 410; a non-magnetic insulating substance tape substrate 411 is caused to travel from feed bobbin 406 to winding bobbin 407, along guide axles 408 and cylindrical cans 409, and an electromagnetic noise absorbing material is deposited on this non-magnetic insulating substance tape substrate 411 in a vacuum. In the Figure, the portions surrounded by a single dot chain line indicate the external magnetic field impression mechanism. In the case in which a multi-layered structure such as that shown in FIG. 1C is manufactured, it is preferable that a plurality of raw material sources 410 be provided in order to increase productivity.

Figure 23A:
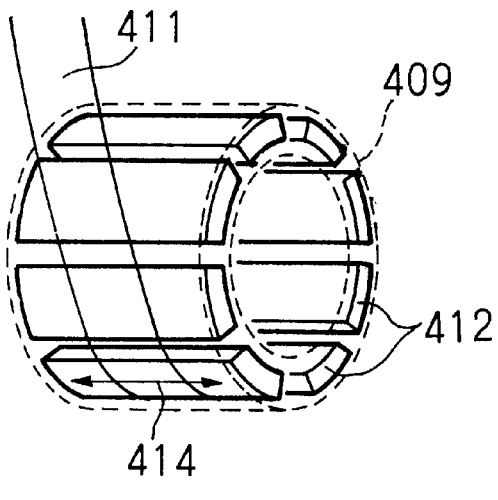
FIGS. 23A, 23B, 23C, and 23D show the details of the mechanism for applying an external magnetic field.
Figure 23B:
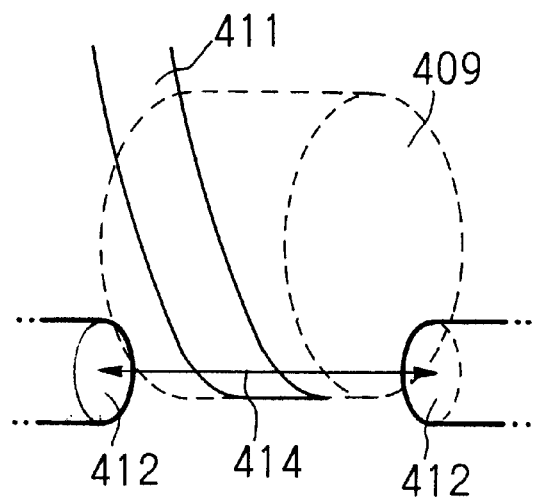
Figure 23C:
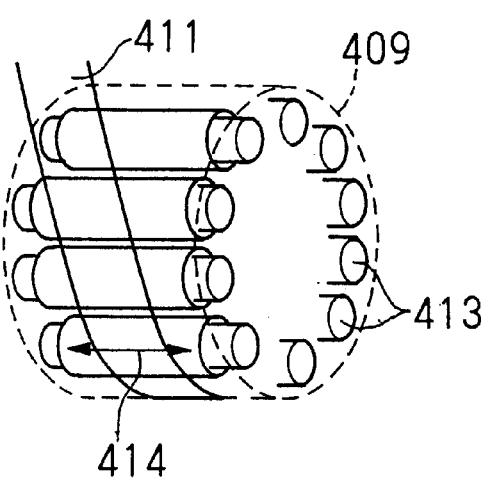
Figure 23D:
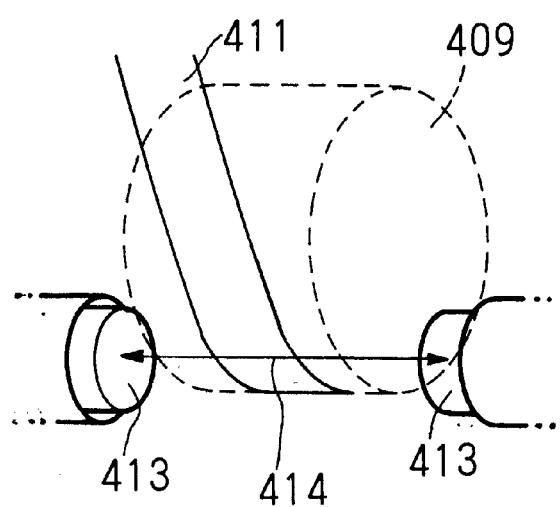

FIGS. 23A~23D show the details of the external magnetic field impression mechanism; reference numeral 414 indicates the direction of the external magnetic field, reference numeral 412 indicates permanent magnets, and reference numeral 413 indicates electromagnets. In FIG. 23A, one or more permanent magnets 412 disposed within cylindrical can 409 are used as the external magnetic field generating source; in FIG. 23B, permanent magnets 412 disposed so as to be on both sides of the cylindrical can 409 are employed as the external magnetic field generating source, in FIG. 23C, electromagnets 413 which are disposed within cylindrical can 409 are employed as the external magnetic field generating source, and in FIG. 23D, electromagnets 413 which are disposed so as to be on both sides of the cylindrical can 409 are used as the external magnetic field generating source. Reference numeral 414 indicates the direction of the external magnetic field, and the polarity of the magnetic field may be in either direction.

An example of a method for the application of a uni-axial magnetic anisotropy within the film surface, apart from the above method, is a method in which, after the electromagnetic noise absorbing material is manufactured without the application of an external magnetic field, the substrate temperature is set to that of the time of deposition or more, and, as shown in FIGS. 23A~23D, an external magnetic field is impressed in a direction within the film surface of the electromagnetic noise absorbing material. Furthermore, another example of a method for the application of uni-axial magnetic anisotropy within the film surface is the oblique deposition method shown in FIG. 5. Similar effects can be obtained by means of any of the above methods.

Examples of the raw material source 410 include an ion beam sputtering source, a RF sputtering source, a magnetron sputtering source, a vapor deposition source, or the like; similar effects can be obtained by means of any of the above.

Figure 24:
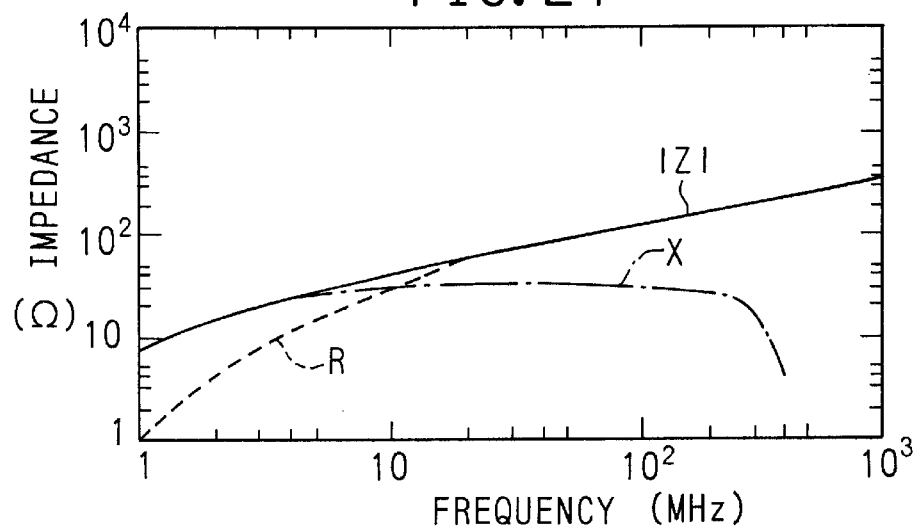
FIG. 24 shows the frequency characteristics of the impedance.
Figure 41:
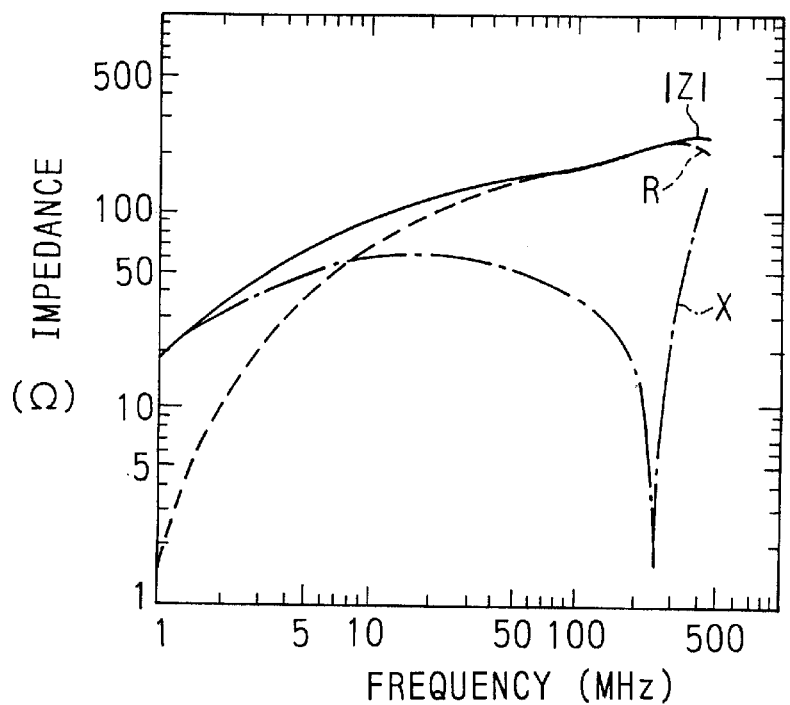
FIG. 41 shows the frequency characteristics of the impedance in a conventional electromagnetic noise filter (ferrite core).

A concrete example employing an electromagnetic noise absorbing material in accordance with the first embodiment (Fig. 1B) will be explained hereinbelow. CozrNb was used as the alloy magnetic substance, $SiO_2$ was used as the non-magnetic insulating substance, PET having a thickness of 6 μm was used as the non-magnetic insulating substance tape substrate, and an ion beam sputtering source was used as the raw material source. The sputtering conditions were such that the operational vacuum degree was Ar1×10$^{-4}$ Torr, the acceleration voltage was 1 kV, and the substrate temperature was within a range of from room temperature to 160° C. The external magnetic field was impressed by means of the method shown in FIG. 23A. The uni-axial magnetic anisotropic magnetic field with the film surface of the CoZrNb during deposition had a strength of 20 Oe, so that this was reduced to 3 Oe by means of heat treatment in a rotating magnetic field (see FIG. 7). The easy axis of the uni-axial magnetic anisotropy within the film surface was the direction of width of the electromagnetic noise filter tape. The value of $\mu_r'(0)$ was 3000, while the value of $\rho_m$ was 120 μΩcm. The thickness of the CozrNb film was set to 2.0 μm, which met the condition that this thickness be within a range of from δ/10 to 10δ, and the thickness of the SiO$_2$ film was set to a level of 0.1 μm, which was capable of maintaining electrical insulation, and deposition was conducted for 4 periods on the PET. In FIG. 24, the frequency characteristics of the impedance are shown in the case in which the present electromagnetic noise filter tape was installed on a cable such as that shown in FIG. 21A. 1 m of an electromagnetic noise filter tape having a width of 10 mm was installed in a spiral wound manner on a cable having a diameter of 10 mm. In FIG. 24, a level within a range of several tens to 300 Ω, comprising Z and R values on the same level as the characteristics of the conventional electromagnetic noise filter (ferrite core) shown in FIG. 41, is obtained. A comparison of the volume of the present electromagnetic noise filter and the conventional filter reveals that a reduction in size of the product of up to $^{1}/_{10}^{2}$ was achieved by the present electromagnetic noise filter, and furthermore, this electromagnetic noise filter is in the form of a tape, so that the flexibility of the cable is not impaired. As is further clear from the diagram, the filter possesses a large impedance even at a level of several hundred MHz or more, so that such a filter is effective even with respect to noise of a few hundred MHz.

Figure 25:
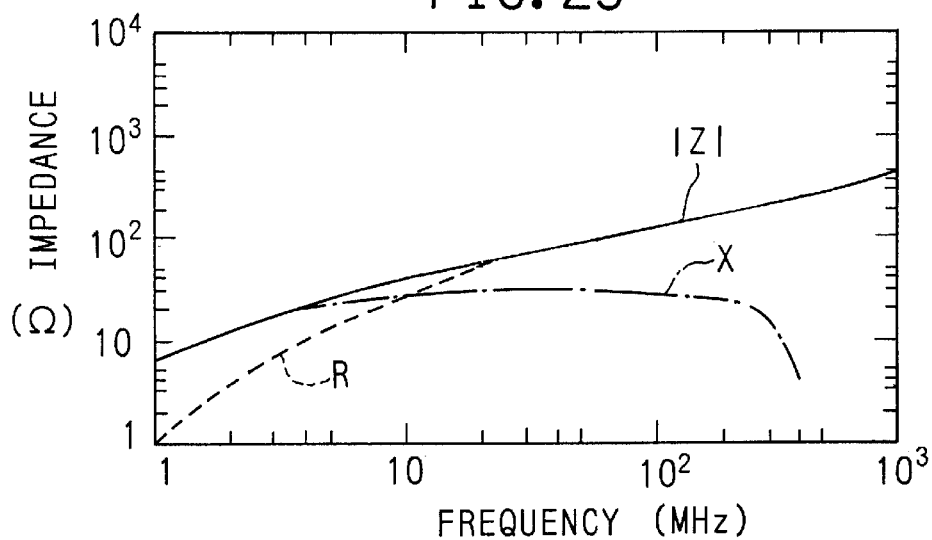
FIG. 25 shows the frequency characteristics of the impedance in the same manner.

Next, an embodiment will be discussed in which NiFe was used as the alloy magnetic substance, SiO$_2$ was used as the non-magnetic insulating substance, PEN having a thickness of 6 μm was used as the non-magnetic insulating substance tape substrate, and a vapor deposition source was used as the raw material source. The temperature of the substrate was set within a range from room temperature to 160° C. The external magnetic field was impressed by the method shown in FIG. 23B. The strength of the uni-axial magnetic anisotropic magnetic field within the film surface was 3 Oe, and the easy axis thereof was set to the direction of width of the electromagnetic noise filter tape. The value of $\mu_r'(0)$ was 3000, while the value of $\rho_m$ was 20 μΩcm. The thickness of the NiFe film was set to 1.5 μm, which met the condition that this thickness be within a range of from δ/10 to 10δ, and the thickness of the SiO$_2$ film was set to 0.1 μm, which was capable of maintaining electrical insulation, and deposition was conducted for 4 periods on the PEN. In FIG. 25, the frequency characteristics of the impedance are shown in the case in which the present electromagnetic noise filter tape was installed on a cable such as that shown in FIG. 21B. Installation was conducted by winding an electromagnetic noise filter tape having a width of 10 mm so as to form 10 layers at 3 positions on a cable having a diameter of 10 mm. In FIG. 25, a level from a few tens to 300 Ω, comprising Z and R values approximately equivalent to the characteristics of the conventional electromagnetic noise filter (ferrite core) shown in FIG. 41, was obtained. A comparison of the volume of the present electromagnetic noise filter and the conventional electromagnetic noise filter reveals that the present electromagnetic noise filter achieved a reduction in size of the product of up to $^{1}/_{10}^{2}$, and furthermore, the filter was in the form of a tape, so that the flexibility of the cable was not adversely affected. As is further clear from the Figure, the filter possessed a large impedance even at a level of a few hundred MHz or more, so that the filter was effective even with respect to electromagnetic noise of a few hundred M[]z.

It is clear that similar effects can be obtained even if the electromagnetic noise absorbing material in accordance with the second embodiment (see FIG. 10) is employed.

Section 5: Third Embodiment of the Electromagnetic Noise Filter

Figure 26:
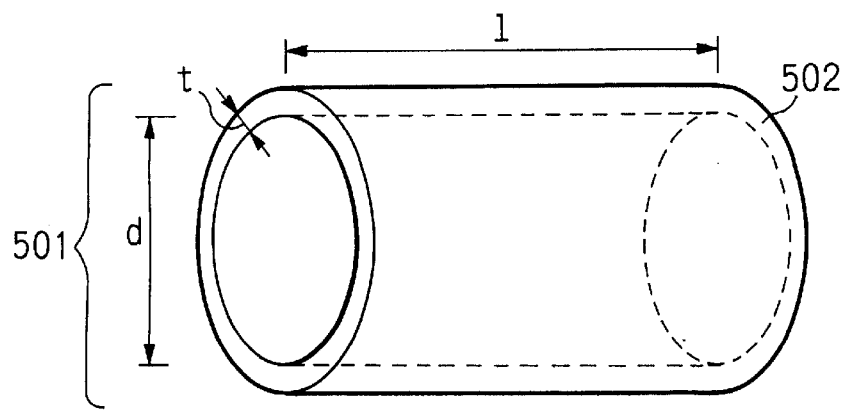
FIG. 26 shows a structural example of an electromagnetic noise filter tube comprising a third embodiment in accordance with the electromagnetic noise filter of the present invention.

FIG. 26 shows the structure of an electromagnetic noise filter tube 501 comprising a third embodiment of the electromagnetic noise filter in accordance with the present invention; this comprises a cylindrical form of the electromagnetic noise absorbing material 502 described above. The greater the total thickness of the electromagnetic noise absorbing material 502, or the longer the tube, the greater the electromagnetic noise suppression effect.

Figure 27:
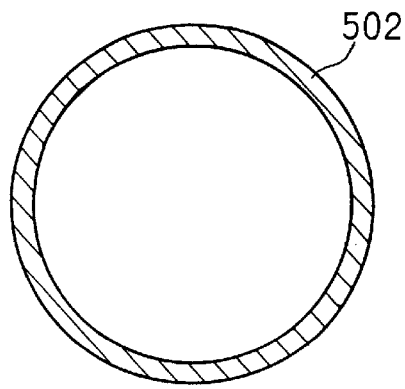
FIG. 27 shows a structural example of an electromagnetic noise absorbing material part of the electromagnetic noise filter tube of FIG. 26.
Figure 28:
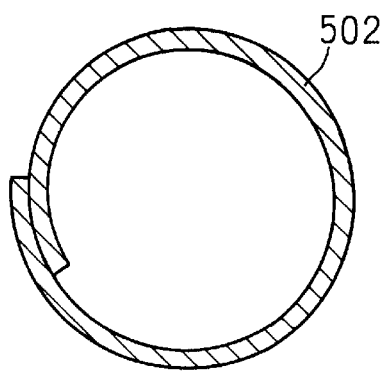
FIG. 28 shows another structural example of an electromagnetic noise absorbing material part of the electromagnetic noise filter tube of FIG. 26.

Identical effects can be obtained whether this electromagnetic noise absorbing material 502 is formed in a closed structure in which the ends thereof are joined to form a circle, as shown in FIG. 27, or whether an open structure is used, in which the ends thereof are not connected, as shown in FIG. 28.

A method was used for manufacturing the electromagnetic noise filter tube in which a electromagnetic noise absorbing material manufactured on a substrate was separated from the substrate, and this sheet form material was rounded into a cylindrical shape. Furthermore, other methods include a method using a material deposited on a cylindrical substrate, a method in which the material was routed to a cylindrical shape from a bulk form, and a method in which a paste-form material was molded into a cylindrical shape.

A concrete example using the electromagnetic noise absorbing material in accordance with the first embodiment (FIG. 1B) will be explained hereinbelow. CoZrNb was used as the alloy magnetic substance, SiO$_2$ was used as the non-magnetic insulating substance, and an electromagnetic noise absorbing material having the characteristics shown in FIG. 17 was employed. The size was such that d=3 mm, t=60 μm, and 1=30 mm. The frequency characteristics of the impedance were identical to those shown in FIG. 18. A level of several tens to 300 Ω, comprising Z and R values approximately equivalent to the characteristics of the conventional electromagnetic noise filter (ferrite core) shown in FIG. 41, was obtained. A comparison of the volume of the present electromagnetic noise filter and the conventional electromagnetic noise filter revealed that the present electromagnetic noise filter achieved a reduction in size of the part of up to $^{1}/_{10}^{2}$, and as is further clear from the Figure, the filter possessed a large impedance even at a few hundred MHz or more, so that the filter was effective even with respect to electromagnetic noise of a few hundred MHz.

It is clear that identical effects can be obtained even if the electromagnetic noise absorbing material in accordance with the second embodiment (FIG. 10) is used.

Section 6: Fourth Embodiment of the Electromagnetic Noise Filter

Figure 29:
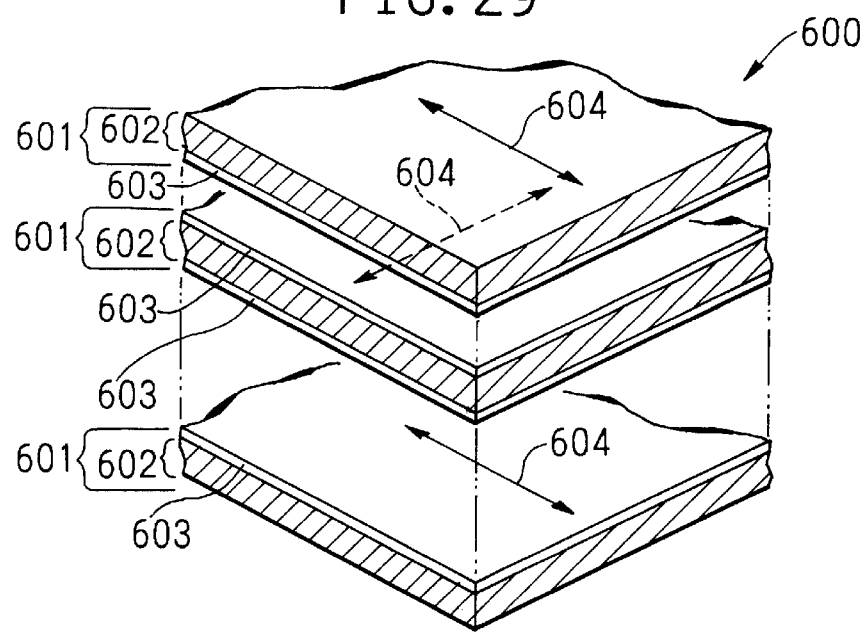
FIG. 29 shows a structural example of an electromagnetic wave absorbing sheet comprising a fourth embodiment of the electromagnetic noise filter in accordance with the present invention.

FIG. 29 shows the structure of an electromagnetic wave absorbing sheet 600 comprising a fourth embodiment of the electromagnetic noise filter in accordance with the present invention; the structure comprises a plurality of overlapping layers of electromagnetic wave absorbing sheets 601 having a structure comprising either only the electromagnetic noise absorbing material 602 described above, or comprising electromagnetic noise absorbing material 602 bonded to a non-magnetic insulating substance sheet substrate 603; the directions 604 of the uni-axial magnetic anisotropy within the film surface of the electromagnetic noise absorbing materials 602 in the various electromagnetic wave absorbing sheets 601 form predetermined angles with respect to one another.

Unwanted electromagnetic waves are incidented onto the electromagnetic wave absorbing sheet from various directions and at various angles. As described above, the electromagnetic noise absorbing material is effective only with respect to unwanted electromagnetic waves possessing a magnetic field component in the direction of the hard axis. An example of a method for making this electromagnetic noise absorbing material effective with respect to unwanted electromagnetic waves at all angles within the film surface is a method in which, as shown in FIG. 29, a plurality of electromagnetic wave absorbing sheets 601 having uni-axial magnetic anisotropy are overlapped in a displaced manner so that the directions 604 of the uni-axial magnetic anisotropy thereof form predetermined angles with respect to one another. Furthermore, in FIG. 1B, it is possible to obtain identical effects even if the directions 105 of uni-axial magnetic anisotropy of each alloy magnetic substance 102 are displaced so as to form predetermined angles with respect to one another.

What is meant here by a "predetermined angle", is an angle within a range of from 0° to 90° which can be formed by the uni-axial magnetic anisotropies; however, an angle within a range of from 10° to 90° is preferable from the point of view of the application thereof. In the case in which this angle is less than 100, the effect resulting from the displacement of the uni-axial magnetic anisotropies is slight, and this is not preferable from the point of view of application. An angle within a range of from 45° to 90° is further preferable; within this range, the effect resulting from the displacement of the uni-axial magnetic anisotropies can be more effectively obtained.

A concrete example employing the electromagnetic noise absorbing material in accordance with the first embodiment (FIG. 1A) is shown below. CozrNb was used as the alloy magnetic substance, while $SiO_2$ was used as the non-magnetic insulating substance. The electromagnetic wave absorbing sheet had the structure shown in FIG. 29. It was determined that characteristics identical to those of FIG. 8 could be obtained with respect to all angles within the sheet surface of the electromagnetic wave absorbing sheet. Furthermore, at 10 MHz or more, $\mu_r$" is greater than $\mu_r$', and the values of $\mu_r$ and $\mu_r$" are much larger than those in the case of the ferrite magnetic substance of FIGS. 37 and 38. As is further clear from the Figure, the large value of $\mu_r$" is maintained even at a few hundred MHz or more, so that such a sheet is effective even with respect to noise of a few hundred MHz.

It is clear that identical effects can be obtained even if an electromagnetic noise absorbing material in accordance with the second embodiment (FIG. 10) is employed.

Section 7: Fifth Embodiment of the Electromagnetic Noise Filter

Figure 30:
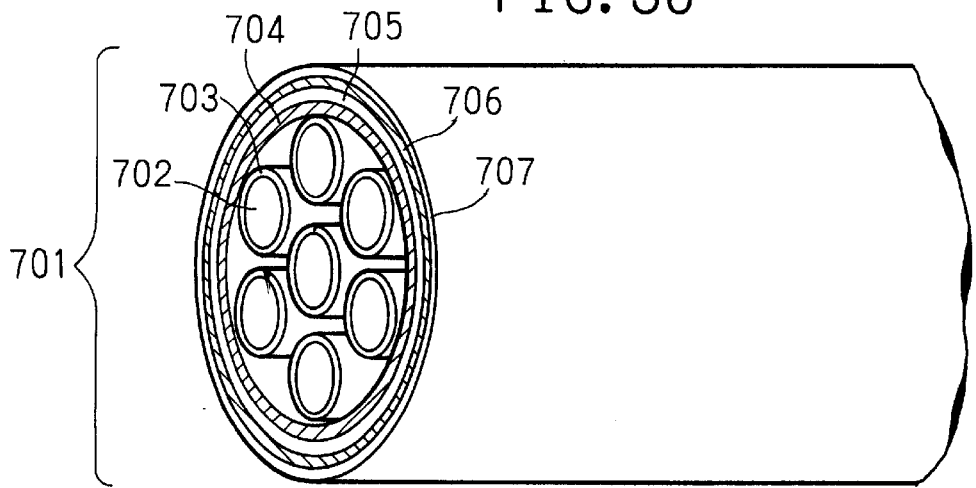
FIG. 30 shows a structural example of an electromagnetic noise filter cable comprising a fifth embodiment of the electromagnetic noise filter in accordance with the present invention.

FIG. 30 shows the structure of an electromagnetic noise filter cable 701 comprising a fifth embodiment of the electromagnetic noise filter in accordance with the present invention; the circumference of one or more conductors 702 clad in an insulating substance 703 is clad in a conductive shield substance 704, and the outer side of the shield substance 704 is clad in the electromagnetic noise absorbing material 706 described above through the medium of an insulating substance 705, and the outer side of the electromagnetic noise absorbing material 706 is further clad in an insulating substance 707.

Here, it is clear that identical effects can be obtained whether the electromagnetic noise absorbing material 706 has a closed structure in which the ends thereof are connected as shown in FIG. 27, or has an open structure in which the ends thereof are not connected as shown in FIG. 28.

Furthermore, it is possible to obtain identical effects whether electromagnetic noise absorbing material 706 is continuously connected in the longitudinal direction of cable 701 or is divided among a number of positions.

Furthermore, insulating substance 705 and insulating substance 707 are necessary from the point of view of the structure in order to provide strength to the cable, but may be omitted where necessary. In the case in which electromagnetic noise absorbing material 706 is conductive, it is possible for the electromagnetic noise absorbing material 706 to possess the function of the shield material 704, so that the shield material 704 may be eliminated. Furthermore, the greater the total thickness of the electromagnetic noise absorbing material 706, or the greater the length thereof, the greater the electromagnetic noise suppression effect.

The manufacturing method of the electromagnetic noise absorbing material for electromagnetic noise filter cables is identical to the manufacturing method of the electromagnetic noise absorbing material described above.

A concrete example using an electromagnetic noise absorbing material in accordance with the first embodiment (FIG. 1B) will be explained hereinbelow. CoZrNb was used as the alloy magnetic substance, and $SiO_2$ was used as the non-magnetic insulating substance, and an electromagnetic noise absorbing material having the characteristics shown in FIG. 17 was employed, and vinyl was used for insulating substances 703 and 707, aluminum leaf was used for shield material 704, and captone was used for insulating material 705. The cable had a diameter of 10 mm, and 24 wires, and the size of the electromagnetic noise absorbing material was such that the diameter thereof was 10 mm, the thickness thereof was 20 $\mu$m, and the length thereof was 300 mm.

Figure 39:
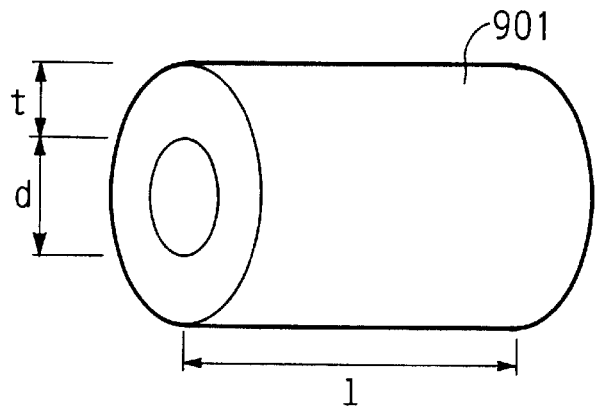
FIG. 39 shows the shape of a conventional electromagnetic noise filter (ferrite core).
Figure 40:
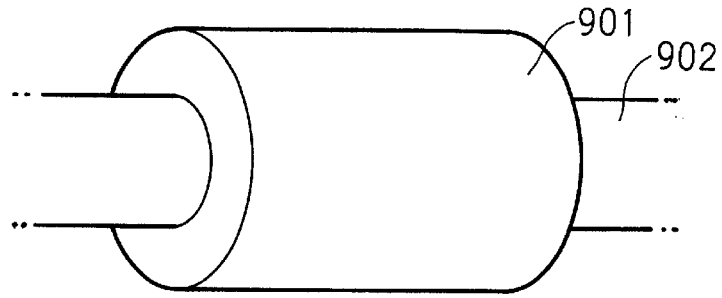
FIG. 40 shows an example of the electromagnetic noise filter of FIG. 39 (ferrite core) installed on a cable.
Figure 44:
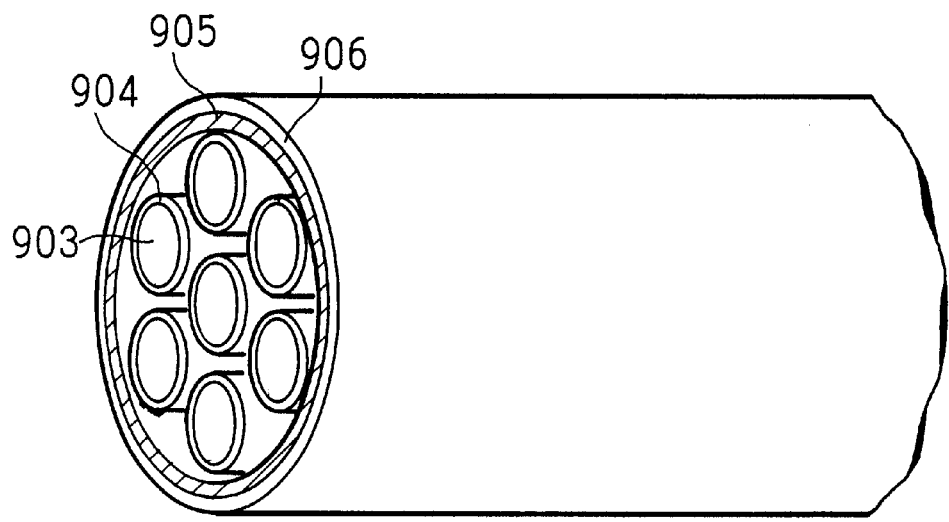
FIG. 44 shows the structure of a conventional cable.
Figure 45:
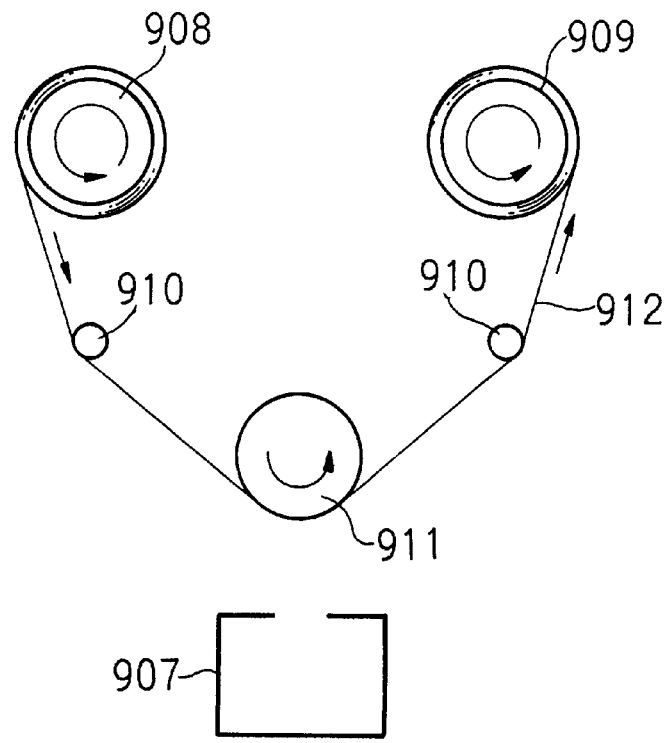
FIG. 45 shows the structure of a conventional metal magnetic tape manufacturing apparatus.

The frequency characteristics of the impedance were identical to those shown in FIG. 18. A comparison with the conventional electromagnetic noise filters (ferrite cores) of FIGS. 39 and 44, and the composition of the conventional cable reveals that, despite the fact that the volume of the cable was essentially unchanged, a level of several tens to 300 $\Omega$, comprising Z and R values approximately equivalent to the characteristics of the conventional electromagnetic noise filter (ferrite core) shown in FIG. 41, was obtained. Furthermore, the flexibility of the cable is not adversely affected, and as is further clear from the Figure, the cable possesses a large impedance even at a few hundred MHz or more, so that such a cable is effective even with respect to electromagnetic noise of a few hundred MHz.

It is clear that identical effects can be obtained even if the electromagnetic noise absorbing material in accordance with the second embodiment (FIG. 10) is employed.

Section 8: Sixth Embodiment of the Electromagnetic Noise Filter

Figure 31A:
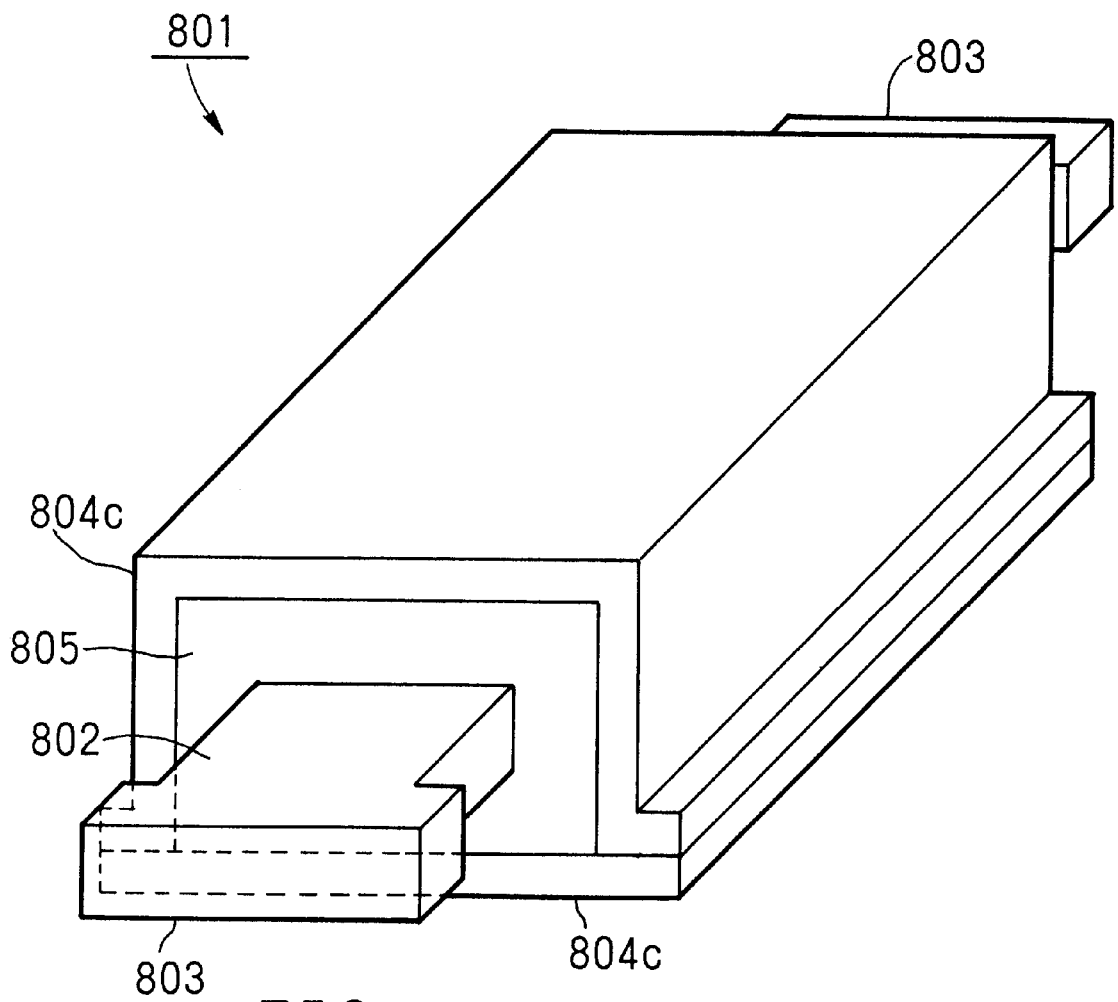
FIGS. 31A and 31B show structural examples of a device-type electromagnetic noise filter comprising a sixth embodiment of the electromagnetic noise filter in accordance with the present invention.
Figure 31B:
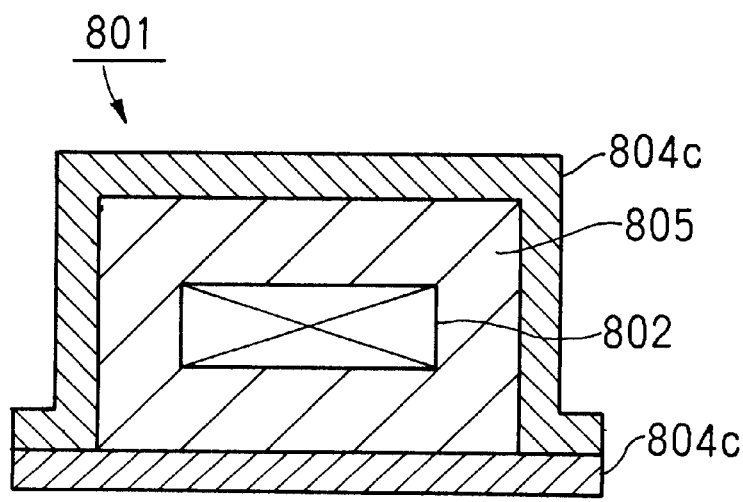

FIGS. 31A and 31B show a device-type noise filter 801 comprising a sixth embodiment of the electromagnetic noise filter in accordance with the present invention; FIG. 31A shows a perspective view, while FIG. 31B shows a cross sectional view.

The electromagnetic noise filter of the present invention is provided with electrode portions at both ends of a conductor film, and electromagnetic noise absorbing material is disposed so as to surround the circumference of the conductor film, or is disposed so as to be present on both sides of the conductor film, and in the case in which the electromagnetic noise absorbing material is conductive, the electromagnetic noise absorbing material is attached to the conductive film through the medium of an insulating substance, while in the case in which the electromagnetic noise absorbing material is insulating, the electromagnetic noise absorbing material is either attached to the conductive film through the medium of an insulating material, or the electromagnetic noise absorbing material is directly attached to the conductor film.

In FIG. 31A, electrode portions 803 are provided at both ends of a conductor film 802, and conductive electromagnetic noise absorbing material 804c is disposed so as to surround the perimeter of one conductor film 802, and this conductive electromagnetic noise absorbing material 804c is attached to the conductor film 802 through the medium of an insulating material 805.

Figure 32A:
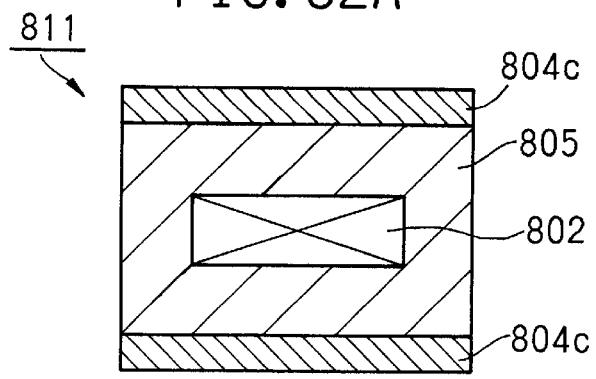
FIGS. 32A, 32B, and 32C are vertical cross sectional views showing other embodiments of the device-type electromagnetic noise filter shown in FIG. 31.
Figure 32B:
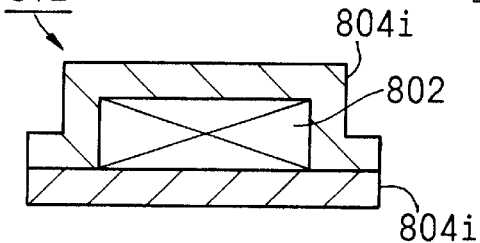
Figure 32C:
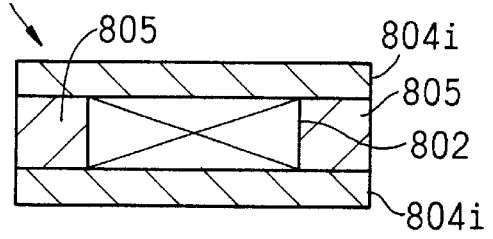

FIGS. 32A~32C show other embodiments of a device-type electromagnetic noise filter, viewed from the same direction as in FIG. 31B.

The electromagnetic noise filter 811 which is shown in FIG. 32A is provided with electrode portions at both ends of a conductor film 802, and conductive electromagnetic noise absorbing material 804c is disposed so as to be present on both the upper and lower sides of one conductor film 802, and this conductive electromagnetic noise absorbing material 804c is attached to conductor film 802 through the medium of an insulating material 805.

The electromagnetic noise filter 812 which is shown in FIG. 32B is provided with electrode portions at both ends of a conductor film 802, and an insulating electromagnetic noise absorbing material 804i is disposed so as to surround the periphery of one conductor film 802, and this insulating electromagnetic noise absorbing material 804i is directly attached to the conductor film 802.

The electromagnetic noise filter 813 shown in FIG. 32C is provided with electrode portions at both ends of a conductor film 802, and an insulating electromagnetic noise absorbing material 804i is disposed so as to be present on the upper and lower sides of the conductor film 802, and this insulating electromagnetic noise absorbing material 804 i is directly attached to the conductive film 802.

In FIGS. 31A, 31B, and 32A, a conductive electromagnetic noise absorbing material 804c was used; however, it is possible to use the insulating electromagnetic noise absorbing material 804i in place of the conductive electromagnetic noise absorbing material 804c shown in FIGS. 31A, 31B, and 32A. That is to say, in the case in which the electromagnetic noise absorbing material 804 is insulating, the electromagnetic noise absorbing material 804 may be attached to conductor film 802 through the medium of an insulating material 805, or the electromagnetic noise absorbing material 804 may be directly attached to the conductor film 802.

Figure 33:
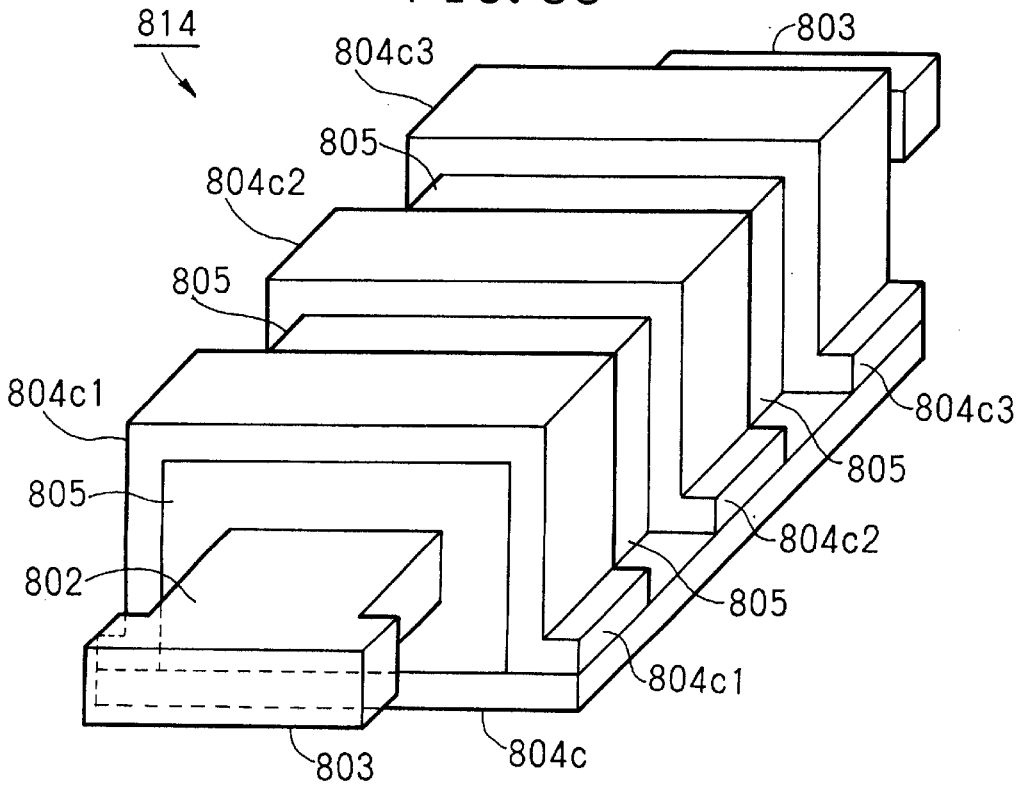
FIG. 33 is a perspective view showing another embodiment of the device type electromagnetic noise filter shown in FIG. 31.

FIG. 33 shows another embodiment of a device-type noise filter in perspective view.

In electromagnetic noise filter 814, three conductive electromagnetic noise absorbing materials 804c1, 804c2, and 804c3, are disposed in place of the one conductive electromagnetic noise absorbing material 804c in electromagnetic noise filter 801. Furthermore, three conductive electromagnetic noise absorbing materials 804c1, 804c2, and 804c3 may be disposed in place of the one conductive electromagnetic noise absorbing material 804c in electromagnetic noise filter 811 shown in FIG. 32A, or three insulating electromagnetic noise absorbing materials may be disposed in place of the one insulating electromagnetic noise absorbing material 804i in noise filters 812 and 813 shown in FIG. 32B and FIG. 32C. Two, or four or more, conductive electromagnetic noise absorbing materials may be disposed instead of disposing the three conductive electromagnetic noise absorbing materials 804c1, 804c2, and 804c3, and two, or four or more, insulating electromagnetic noise absorbing materials may be disposed instead of disposing these three insulating electromagnetic noise absorbing materials.

FIGS. 34A~34D show vertical cross sectional views of other structural examples relating to the present embodiment; in these examples, a plurality of conductor films 802 are disposed.

Figure 34:
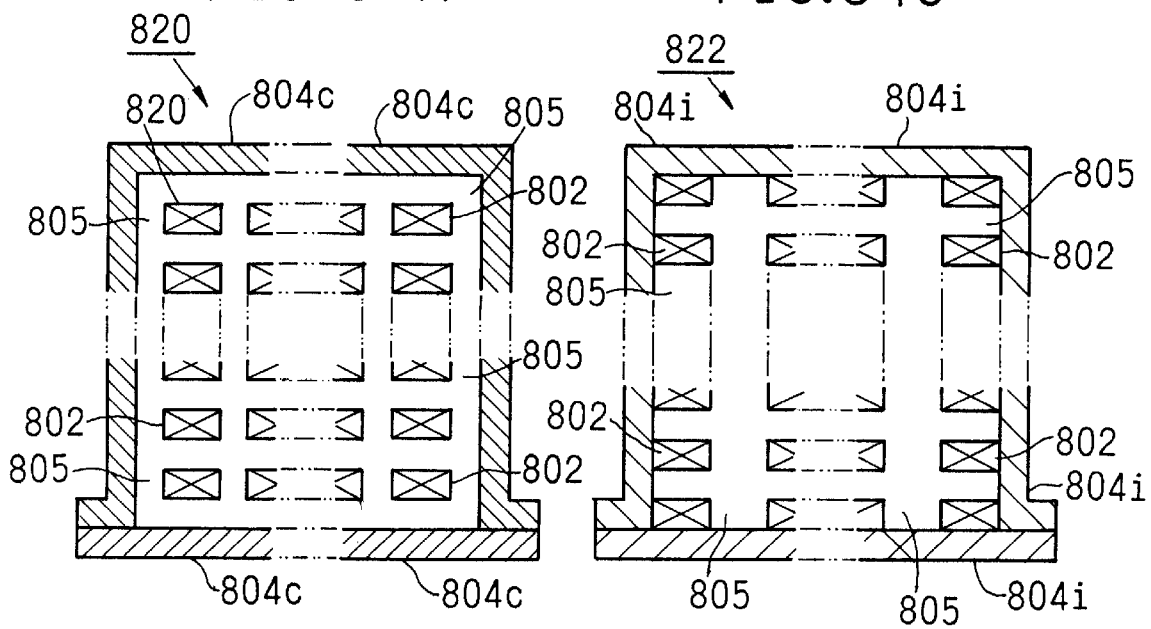
FIGS. 34A, 34B, 34C, and 34D are vertical cross sectional views showing other structural examples of the device-type electromagnetic noise filter comprising the sixth embodiment of the electromagnetic noise filter in accordance with the present invention; in these examples, a plurality of conductive films 802 are disposed.

The electromagnetic noise filter 820 shown in FIG. 34A is provided with electrode portions at both ends of the conductor films, and a plurality of conductor films 802, 802, 802, . . . , are positioned so as to be parallel to one another through the medium of insulating substances 805, and a conductive electromagnetic noise absorbing material 804c is disposed around this plurality of conductor films 802, 802, 802, . . . , so as to form one layer, and this conductive electromagnetic noise absorbing material 804c is attached to conductor films 802 through the medium of insulating substances 805.

The electromagnetic noise filter 821 which is shown in FIG. 34B is provided with electrode portions at both ends of the conductor films 802, and a plurality of conductor films 802, 802, 802, . . . , are positioned so as to be parallel to one another through the medium of insulating substance 805, and conductive electromagnetic noise absorbing materials 804c are disposed so as to be present on both sides of this plurality of conductor films 802, 802, 802, . . . , and these conductive electromagnetic noise absorbing materials 804c are attached to conductor films 802 through the medium of insulating substances 805.

The electromagnetic noise filter 822 which is shown in FIG. 34C is provided with electrode portions at both ends of the conductor films 802, and a plurality of conductor films 802, 802, 802, . . . , are positioned so as to be parallel to one another through the medium of insulating substances 805, and an insulating electromagnetic noise absorbing material 804i is disposed around the periphery of this plurality of conductor films 802, 802, 802, . . . , so as to form one layer, and this insulating electromagnetic noise absorbing material 804i is directly attached to conductor films 802.

The electromagnetic noise filter shown in FIG. 34D is provided with electrode portions at both ends of the conductor films 802, and a plurality of conductor films 802, 802, 802, . . . , are positioned so as to be parallel to one another through the medium of insulating substances 805, and insulating electromagnetic noise absorbing materials 804i are disposed so as to be present on both sides of this plurality of conductor films 802, 802, 802, . . . , and these insulating electromagnetic noise absorbing materials 804i are attached directly to the conductor films 802.

In FIGS. 34A and 34B, conductive electromagnetic noise absorbing materials 804c were employed; however, in place of the conductive electromagnetic noise absorbing materials 804c, the insulating electromagnetic noise absorbing materials 804i may be used in FIGS. 34A and 34B. That is to say, in the case in which the electromagnetic noise absorbing material 804 is insulating, the electromagnetic noise absorbing material 804 may be attached to conductor film 802 through the medium of insulating substance 805, or the electromagnetic noise absorbing material 804 may be directly attached to conductor film 802. Furthermore, one or a plurality of the electromagnetic noise absorbing materials 804 shown in FIGS. 34A, 34B, 34C, and 34D, may be present.

Furthermore, in FIGS. 34A~34D, conductor films 802, 802, 802, . . . , are disposed in N rows and M columns within the electromagnetic noise absorbing material 804 or therebetween, and N and M represent freely selected positive integers having a value of 1 or more.

Figure 35:
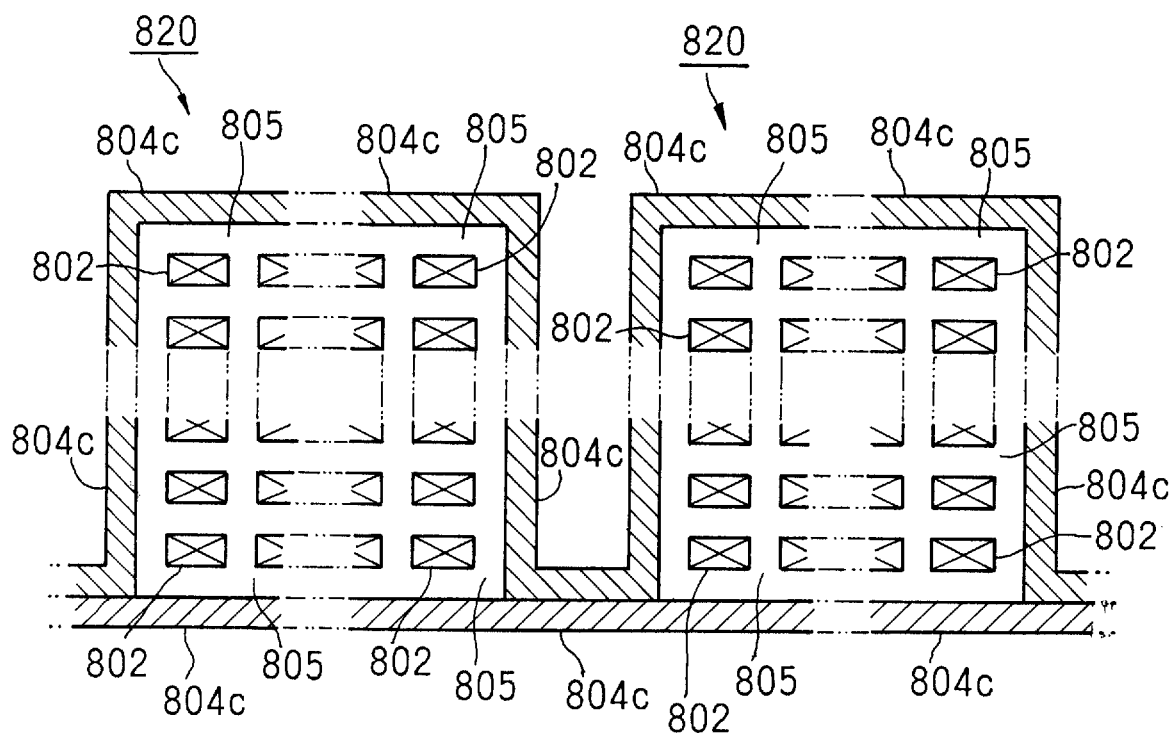
FIG. 35 shows another embodiment of the electromagnetic noise filter 820 shown in FIG. 34A; two electromagnetic noise filters 820 are arranged so as to be parallel in a horizontal plane, and these are made integral.

FIG. 35 shows another embodiment of the electromagnetic noise filter 820 shown in FIG. 34A; two electromagnetic noise filters 820 are disposed in a horizontal row, and these are made integral.

In the electromagnetic noise filter shown in FIG. 35, two electromagnetic noise filters 820 were disposed in a horizontal row; however, three or more electromagnetic noise filters 820 may be disposed in a horizontal row.

With respect to the electromagnetic noise filter 810 shown in FIG. 31A, the electromagnetic noise filters 811, 812, and 813 shown in FIGS. 32A~32C, and the electromagnetic noise filters 821, 822, and 823 shown in FIGS. 34B, 34C, and 34D, in the same manner as the electromagnetic noise filter shown in FIG. 35, a plurality thereof may be disposed in a horizontal row, and this structure may be made integral.

As shown in FIGS. 31B, 32A~32C, and 33, a filter possessing one conductor film 802 functions as a filter for normal mode electromagnetic noise, while as shown in FIGS. 34A~34D and 35, a filter possessing a plurality of conductor films 802 functions as a common mode electromagnetic noise filter.

Figure 36:
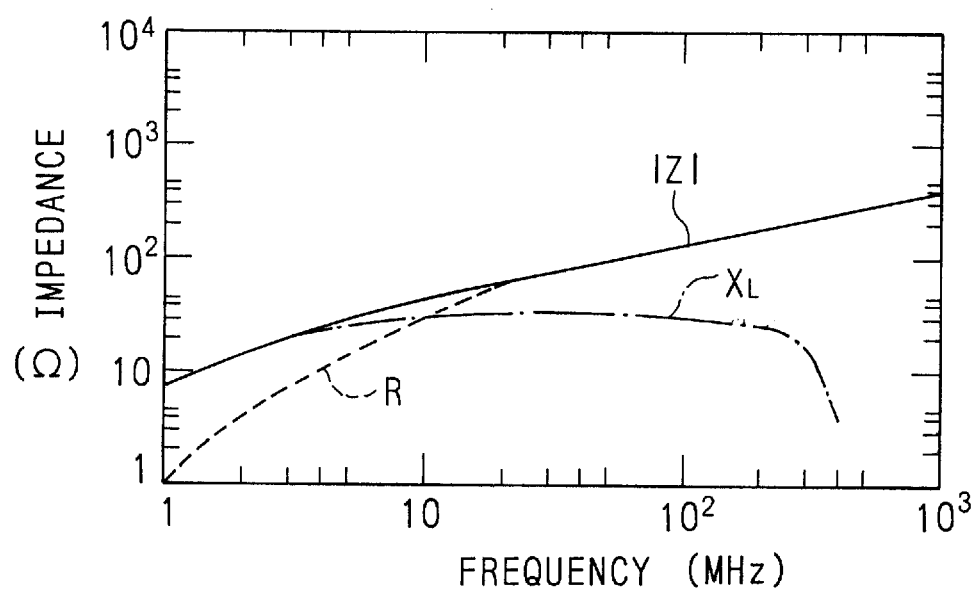
FIG. 36 shows the frequency characteristics of the impedance of the device-type electromagnetic noise filter shown in FIG. 31.
Figure 42:
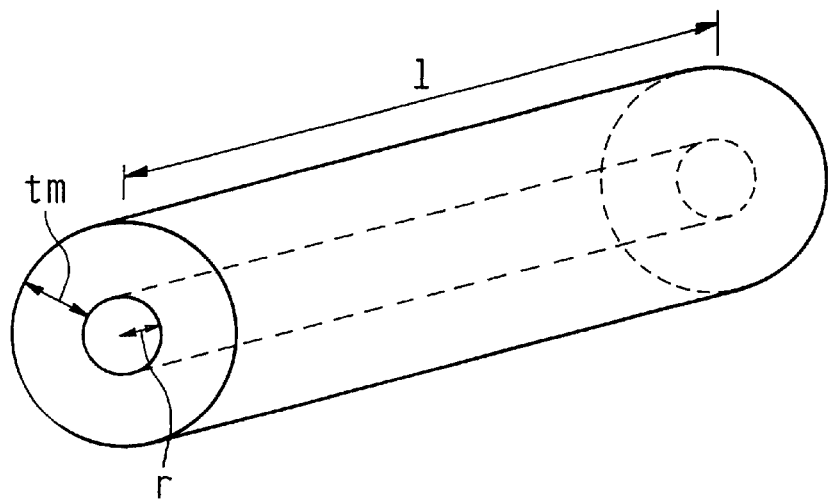
FIG. 42 is a perspective view showing the shape of a conventional electromagnetic noise filter (ferrite bead).
Figure 43:
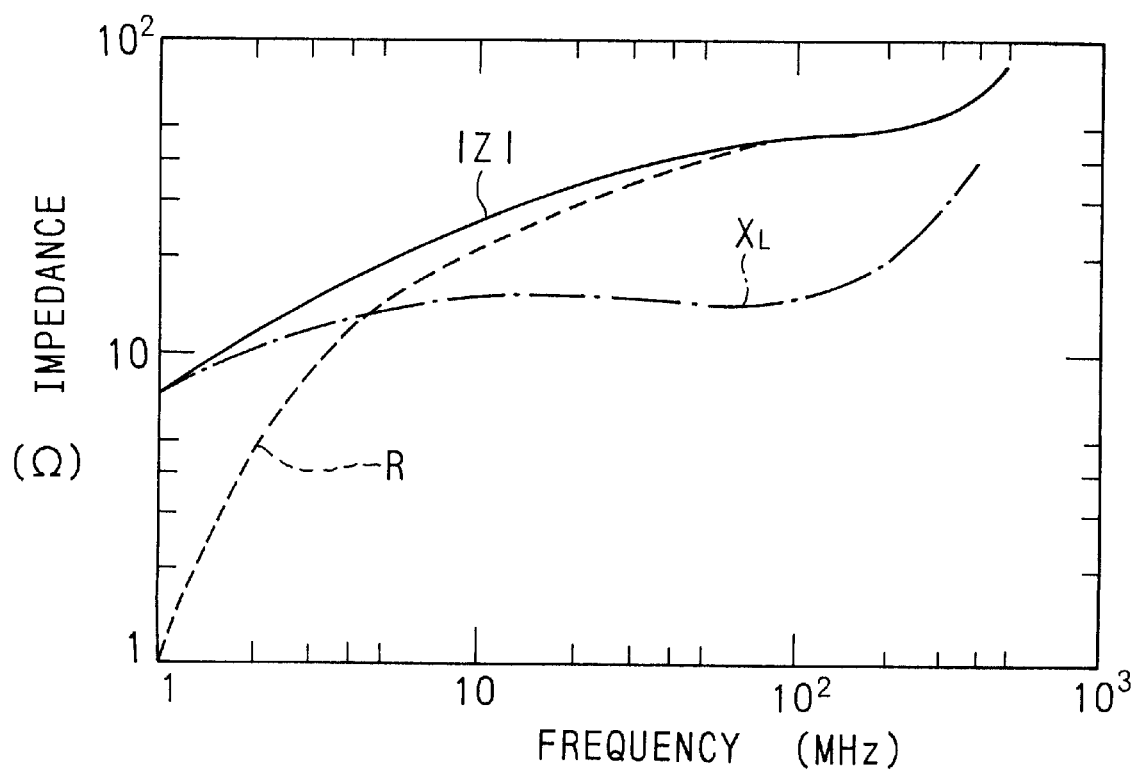
FIG. 43 shows the frequency characteristics of the impedance in the electromagnetic noise filter shown in FIG. 42 (ferrite bead).

A concrete example is given hereinbelow. In FIG. 36, the frequency characteristics of the impedance are shown in the electromagnetic noise filter shown in FIG. 31A, in the case in which the film thickness of the insulating substance was set to 10 µm, the film thickness of the electromagnetic noise absorbing material was set to 10 µm, and the length thereof was set to 5 mm. Cu was used as the conductor film, $SiO_2$ was used as the insulating substance, and a ferrite magnetic substance having a value of $\mu_r'(0)=1500$, which was identical to the conventional electromagnetic noise filter shown in FIGS. 42 and 43, was used as the electromagnetic noise absorbing material. In FIG. 36, the impedance was within a range of from several tens to 200 Ω in the 30–1000 MHz band, and an impedance value was realized which was equivalent to or greater than that of the conventional electromagnetic noise filters shown in FIGS. 42 and 43, and the size thereof was reduced.

In this manner, in the present electromagnetic noise filter, even if conventional electromagnetic noise absorbing materials are employed, in comparison with conventional electromagnetic noise filters, the size can be reduced, so that when the electromagnetic noise absorbing material in accordance with the present invention which is described above is employed, it is clear that this effect can be further increased.

What is claimed is:

1. An electromagnetic noise absorbing material comprising a film shaped alloy magnetic substance, a thickness of said alloy magnetic substance being within a range of from $\frac{1}{10}$ to 10 times a skin depth thereof, wherein said skin depth represents a depth, measured from a surface of said alloy magnetic substance, to which a high frequency electromagnetic wave is capable of penetratin said alloy magnetic substance, and using an electrical resistivity $\rho_m$ of the alloy magnetic substance, a frequency f, the real part of $\mu_r'(0)$ of a static relative magnetic permeability, and a magnetic permeability of go of a vacuum, said skin depth is expressed by the following formula:

$$\delta=[2\rho_m/2\pi f.\mu_r'(0).\mu_0]^{1/2}$$

wherein a plurality of layers of said alloy magnetic substance and a non-magnetic insulating substance are alternately deposited to form a multi-layered structure.

2. The electromagnetic noise absorbing material in accordance with claim 1, wherein, in said multi-layered structure, a thickness said each non-magnetic insulating substance is sufficient to maintain electrical insulation between said alloy magnetic substances adjacent to the non- magnetic insulating substance.

3. An electromagnetic noise absorbing material comprising a film shaped alloy magnet c substance, a thickness of said alloy magnetic substance being within a range offrom $\frac{1}{10}$ to 10 times; a skin depth thereof, wherein said skin depth represents a depth, measured from a surface of said alloy magnetic substance, to which a high frequency electromagnetic wave is capable ofpenetrating said alloy magnetic substance, and using an electrical resistivity $\rho_m$ ofthe alloy magnetic substance, a frequency f, the real part $\mu_r'(0)$ of a static relative magnetic permeability, and a magnetite permeability $\mu_0$ of a vacuum, said skin depth is expressed by the following formula:

$$\delta=[2\rho_m/2\pi f.\mu_r'(0).\mu_0]^{1/2}$$

wherein said alloy magnetic substance possesses uni-axial magnetic anisotropy in a direction parallel with a film surface thereof, and a plurality of layers of said alloy magnetic substance and a non- magnetic insulating substance are alternately deposited to form a multi-layered structure.

4. The electromagnetic noise absorbing material in accordance with claim 3, wherein. in said multi-layered structure, a thickness of said non-magnetic insulating substance is sufficient to maintain electrical insulation between two of said alloy magnetic substances adjacent to the norL- magnetic insulating substance.

5. The electromagnetic noise absorbing material in accordance with one of claims 1 to 4, wherein the electromagnetic noise absorbing material is wound in at least one layer in a, cylindrical shape, and a non-magnetic insulating substance is bonded to both sides of said electromagnetic noise absorbing material.

6. The electromagnetic noise absorbing material in accordance with one of claims 1 to 4 wherein the electromagnetic noise absorbing material is formed in a tape shape, and a non-magnetic insulating substance is bonded to both sides of said electromagnetic noise absorbing material.

7. The electromagnetic noise absorbing material in accordance with one of claims 1 to 4, wherein the electromagnetic noise absorbing material is formed in a cylindrical shape.

8. The electromagnetic noise absorbing material in accordance with one of claims 1 and 3, wherein the skin depth is determined in a desired frequency range including a band of fevs hundred MHZ.

9. The electromagnetic noise absorbing material in accordance with claim 8, wherein an imaginary part of a relative magnetic permeability is more than 1 02 in the band of a few hundred MHz.

10. The electromagnetic noise absorbing material in accordance with one of claims 1 through 4, having a structure in which a plurality of electromagnetic wave absorbing sheets comprising only an electromagnetic noise absorbing material are layered, and in each electromagnetic wave absorbing sheet, directions of uni-a„ial magnetic anisotropy within film surfaces of said alloy magnetic substances of said multi-layered structure form predetermined angles with respect to one another.

11. The electromagnetic noise absorbing material in accordance with one of claims 1 through 4, having a structure in which a plurality of electromagnetic wave absorbing sheets, in which the electromagnetic noise absorbing material is bonded to a non- magnetic insulating substance sheet substrate, are layered, and in each electromagnetic wave absorbing sheet, directions of uni-axial magnetic anisotropy within film surfaces of said alloy magnetic substances of said multi-layered structure form predetermined angles with respect to one another.

12. The electromagnetic noise absorbing material in accordance with one of claims 3 and 4, comprising an electromagnetic wave absorbing sheet, wherein directions of uni-axial magnetic anisotropy within film surfaces of said alloy magnetic substances of said multi-layered structure form predetermined angles with respect to one another.

13. The electromagnetic noise absorbing material in accordance with one of claims 1 through 4, comprising an electromagnetic noise filter cable, in which a conductive shield substance clads a circumference of at least one conductor, an outer side of said shield substance is clad with said electromagnetic noise absorbing material through an insulating substance, and an outer side of said electromagnetic noise absorbing material is further clad with an insulating substance.

14. The electromagnetic noise absorbing material in accordance with one of claims 1 through 4, comprising a device-type electromagnetic noise filter, possessing electrode parts at both ends of a conductive film, wherein said electromagnetic noise absorbing material is disposed to surround said conductive film, and said electromagnetic noise absorbing material is conductive and is attached to said conductive film through an insulating substance.

15. The electromagnetic noise absorbing material in accordance with one of claims 1 through 4, comprising a device-type electromagnetic noise filter, possessing electrode parts at both ends of a conductive film, wherein said electromagnetic noise absorbing material is disposed to surround said conductive film, and said electromagnetic noise absorbing material is insulating and is attached to said conductive film through an insulating substance.

16. The electromagnetic noise absorbing material in accordance with one of claims 1 through 4, comprising a device-type electromagnetic noise filter, possessing electrode parts at both ends of a conductive film, wherein said electromagnetic noise absorbing material is disposed on both sides of said conductive film, and said electromagnetic noise absorbing material is conductive and is attached to said conductive film through an insulating substance.

17. The electromagnetic noise absorbing material in accordance with one of claims 1 through 4, comprising a device-type electromagnetic noise filter, possessing electrode parts at both ends of a conductive film, wherein said electromagnetic noise absorbing material is disposed on both sides of said conductive film, and said electromagnetic noise absorbing material is insulating and is attached to said conductive film through an insulating substance.

18. The electromagnetic noise absorbing material in accordance with one of claims 11 through 4, comprising a device-type electromagnetic noise filter, possessing electrode parts at both ends of a conductive film, wherein said electromagnetic noise absorbing material is disposed to surround said conductive film, and said electromagnetic noise absorbing material is insulating and is directly attached to said conductive film.

19. The electromagnetic noise absorbing material in accordance with one of claims 1 through 4, comprising a device-type electromagnetic noise filter, possessing electrode parts at both ends of a conductive film, wherein said electromagnetic noise absorbing material is disposed on both sides of said conductive film, and said electromagnetic noise absorbing material is insulating and is directly attached to said conductive film.

20. An electromagnetic noise filter tape manufacturing method, wherein, in the case in which an electromagnetic noise absorbing material in accordance with one of claims 1 through 4 is manufactured by a thin film manufacturing method possessing a feed ribbon, a winding ribbon, at least one guide axle, at least one cylindrical can, and at least one raw material source, wherein a non-magnetic insulating tape substrate is caused to travel from said feed bobbin to said winding bobbin along said guide axle and said cylindrical can, and a magnetic substance is deposited on said non-magnetic insulating tape substrate in a vacuum, said electromagnetic noise absorbing material is deposited while applying an external magnetic field in a pre-specified direction within a film surface of said electromagnetic noise absorbing material.

21. An electromagnetic noise filter tape manufacturing apparatus, wherein, in the case in which an electromagnetic noise absorbing material in accordance with one of claims 1 through 4 is manufactured using a thin film manufacturing apparatus possessing a feed bobbin, a winding bobbin, at least one guide axle, at least one cylindrical can, and at least one raw material source, wherein a non-magnetic insulating tape substrate is caused to travel from said feed bobbin to said winding bobbin along said guide axle and said cylindrical can, and a magnetic material is deposited on said non-magnetic insulating tape substrate in a vacuum, a mechanism for applying an external magnetic field in a pre-specified direction within a film surface of said electromagnetic noise absorbing material during deposition of said electromagnetic noise absorbing material is provided.

* * * * *

UNITED STATES PATENT AND TRADEMARK OFFICE
CERTIFICATE OF CORRECTION

PATENT NO. : 5,990,417

DATED : November 23, 1999

INVENTOR(S) : Masakatsu Senda et al.

It is certified that error appears in the above-identified patent and that said Letters Patent is hereby corrected as shown below:

Claim 1, col. 24, line 2, "penetratin" should read --penetrating--.
Claim 1, col. 24, line 6, "of go" should read --$\mu_0$--.
Claim 1, col. 24, line 8, "$\delta=[2\rho_m/2\pi f.\mu_r'(0).\mu_0]^{1/2}$" should read
    --$\delta=[2\rho_m/2\pi f \cdot \mu_r'(0) \cdot \mu_0]^{1/2}$--.
Claim 2, col. 24, line 14, after "thickness", insert --of--; and after
    "said", delete "each".
Claim 2, col. 24, line 16,
    "substances" should read --substance--; and
    non- magnetic" should read --non-magnetic--.
Claim 3, col. 24, line 19, "magnet c" should read --magnetic--.
Claim 3, col. 24, line 20, "offrom" should read --of from--.
Claim 3, col. 24, line 21, after "times", delete ";".
Claim 3, col. 24, line 24, "ofpenetrating" should read --of penetrating--.
Claim 3, col. 24, line 25, "ofthe" should read --of the--.
Claim 3, col. 24, line 27, "magnetite" should read --magnetic--.
Claim 3, col. 24, line 30, "$\delta=[2\rho_m/2\pi f.\mu_r'(0).\mu_0]^{1/2}$" should read
    --$\delta=[2\rho_m/2\pi f \cdot \mu_r'(0) \cdot \mu_0]^{1/2}$--.

UNITED STATES PATENT AND TRADEMARK OFFICE
CERTIFICATE OF CORRECTION

PATENT NO. : 5,990,417

DATED : November 23, 1999

INVENTOR(S) : Masakatsu Senda et al.

It is certified that error appears in the above-identified patent and that said Letters Patent is hereby corrected as shown below:

Claim 3, col. 24, line 35, "non- magnetic" should read --non-magnetic--.
Claim 4, col. 24, line 39, "wherein." should read --wherein,--.
Claim 4, col. 24, lines 42-43, "norL- magnetic" should read
    --non-magnetic--.
Claim 5, col. 24, line 46, after "a", delete ",".
Claim 6, col. 24, line 51, after "1 to 4", insert --,--.
Claim 8, col. 24, line 61, "fevs" should read --few--.
Claim 9, col. 24, line 64, "1 02" should read --$10^2$--.
Claim 10, col. 25, line 4, "uni-a,,ial" should read --uni-axial--.
Claim 11, col. 25, line 12, "non- magnetic" should read --non-magnetic--.
Claim 18, col. 26, line 10, "claims 11 through 4" should read
    --claims 1 through 4--.

Signed and Sealed this

Tenth Day of April, 2001

*Attest:*

NICHOLAS P. GODICI

*Attesting Officer*   *Acting Director of the United States Patent and Trademark Office*